United States Patent
Corneille et al.

(10) Patent No.: US 10,425,035 B2
(45) Date of Patent: Sep. 24, 2019

(54) MODULE CONNECTOR FOR FLEXIBLE PHOTOVOLTAIC MODULE

(71) Applicant: Miasolé Hi-Tech Corp., Santa Clara, CA (US)

(72) Inventors: Jason Stephen Corneille, San Jose, CA (US); Nicholai Busch, Mountain View, CA (US); Richard Weinberg, Cupertino, CA (US); John Huang, San Jose, CA (US)

(73) Assignee: Miasolé Hi-Tech Corp., Santa Clara, CA (US)

( * ) Notice: Subject to any disclaimer, the term of this patent is extended or adjusted under 35 U.S.C. 154(b) by 179 days.

(21) Appl. No.: 15/705,910

(22) Filed: Sep. 15, 2017

(65) Prior Publication Data
US 2019/0089294 A1    Mar. 21, 2019

(51) Int. Cl.
*H01L 31/042* (2014.01)
*H02N 6/00* (2006.01)
*H02S 20/30* (2014.01)
*H02S 30/10* (2014.01)

(52) U.S. Cl.
CPC .............. *H02S 20/30* (2014.12); *H02S 30/10* (2014.12)

(58) Field of Classification Search
CPC ... H02S 40/34; H02S 40/36; H01L 31/02013; H01L 31/02002; H01L 31/02008
See application file for complete search history.

(56) References Cited

U.S. PATENT DOCUMENTS

| 3,291,636 A | 12/1966 | Reighter et al. |
| 3,325,769 A | 6/1967 | Travis |
| 3,838,234 A | 9/1974 | Peterson |

(Continued)

FOREIGN PATENT DOCUMENTS

| EP | 2429002 | 3/2012 |
| WO | 2009/137347 | 11/2009 |

(Continued)

OTHER PUBLICATIONS

U.S. Appl. No. 13/042,317, Notice of Allowance dated Dec. 7, 2012.

(Continued)

*Primary Examiner* — Angelo Trivisonno
(74) *Attorney, Agent, or Firm* — Weaver Austin Villenueve & Sampson LLP

(57) ABSTRACT

Disclosed are module connectors for flexible photovoltaic modules. A module connector may include a clamp and an insert configured to be inserted into the clamp. The insert may have an insert body, an electrical lead and an electrical connector. The clamp may have a body portion with a recess configured to receive the insert body, a first clamping portion configured to clamp a second portion of the electrical connector to connect it to the body portion, and a second clamping portion with a first clamping surface configured to contact a first sheet of the module and a second clamping surface configured to contact a second sheet of the module. The second clamping portion may be configured to connect the clamp to the module such that the clamp overlaps and extends around a part of the first sheet, a part of the module's exterior edge surface, and a part of the second sheet.

20 Claims, 11 Drawing Sheets

(56) References Cited

U.S. PATENT DOCUMENTS

| | | | |
|---|---|---|---|
| 4,754,285 A | 6/1988 | Robitaille | |
| 4,847,818 A | 7/1989 | Olsen | |
| 5,043,024 A * | 8/1991 | Cammerer | H01L 31/02008 |
| | | | 136/244 |
| 5,059,254 A | 10/1991 | Yaba et al. | |
| 5,179,733 A | 1/1993 | Matsui | |
| 5,209,987 A | 5/1993 | Penneck | |
| 5,218,577 A | 6/1993 | Seager | |
| 5,232,518 A | 8/1993 | Nath et al. | |
| 5,391,235 A | 2/1995 | Inoue | |
| 5,482,569 A | 1/1996 | Ihara et al. | |
| 5,526,006 A | 6/1996 | Akahane et al. | |
| 6,066,796 A | 5/2000 | Itoyama et al. | |
| 6,111,189 A | 8/2000 | Garvison et al. | |
| 6,456,724 B1 | 9/2002 | Watanabe | |
| 6,534,768 B1 | 3/2003 | Ciurczak et al. | |
| 6,576,830 B2 | 6/2003 | Nagao et al. | |
| 6,707,689 B2 | 3/2004 | Momota et al. | |
| 6,840,799 B2 | 1/2005 | Yoshikawa et al. | |
| 6,967,278 B2 | 11/2005 | Hatsukaiwa et al. | |
| 7,056,145 B2 | 6/2006 | Campbell, III et al. | |
| 7,138,578 B2 | 11/2006 | Komamine | |
| 7,297,867 B2 | 11/2007 | Nomura et al. | |
| 7,387,537 B1 | 6/2008 | Daily et al. | |
| 7,708,578 B1 | 5/2010 | Lenox | |
| 7,713,089 B2 | 5/2010 | Faust et al. | |
| 7,726,301 B2 | 6/2010 | Shin et al. | |
| 7,762,832 B2 | 7/2010 | Minnick | |
| 7,789,700 B2 | 9/2010 | Wang et al. | |
| 7,824,191 B1 | 11/2010 | Browder | |
| 7,854,095 B2 | 12/2010 | Banister | |
| 7,963,802 B2 | 6/2011 | Corneille et al. | |
| 7,987,641 B2 | 8/2011 | Cinnamon | |
| 8,147,274 B2 | 4/2012 | Mizukami | |
| 8,158,450 B1 | 4/2012 | Sheats et al. | |
| 8,192,207 B2 | 6/2012 | Iida | |
| 8,286,393 B2 | 10/2012 | Reyal et al. | |
| 8,333,040 B2 | 12/2012 | Shioa et al. | |
| 8,414,308 B1 | 4/2013 | Meyers | |
| 8,613,169 B2 | 12/2013 | Sherman et al. | |
| 8,656,657 B2 | 2/2014 | Livsey et al. | |
| 8,695,289 B2 | 4/2014 | Koch et al. | |
| 8,813,460 B2 | 8/2014 | Cinnamon et al. | |
| 9,112,080 B1 | 8/2015 | Corneille et al. | |
| 9,231,123 B1 | 1/2016 | Sherman | |
| 9,577,133 B2 | 2/2017 | Sherman | |
| 9,735,728 B2 | 8/2017 | Dhir et al. | |
| 9,866,168 B2 | 1/2018 | Krajewski | |
| 9,935,225 B2 | 4/2018 | Corneille et al. | |
| 2003/0098059 A1 | 5/2003 | Hanoka | |
| 2003/0227663 A1 | 12/2003 | Agrawak et al. | |
| 2004/0040619 A1 | 3/2004 | Dehn et al. | |
| 2005/0000562 A1 | 1/2005 | Kataoka et al. | |
| 2005/0061360 A1 | 3/2005 | Horioka et al. | |
| 2006/0054213 A1 | 3/2006 | Baret et al. | |
| 2006/0219291 A1 | 10/2006 | Hikosaka et al. | |
| 2008/0053511 A1 | 3/2008 | Nakamura | |
| 2008/0149170 A1 | 6/2008 | Hanoka | |
| 2008/0156365 A1 | 7/2008 | Scholz et al. | |
| 2008/0160804 A1 | 7/2008 | Daily et al. | |
| 2008/0196756 A1 | 8/2008 | Basol | |
| 2008/0271774 A1 | 11/2008 | Kalkanoglu et al. | |
| 2008/0280509 A1 * | 11/2008 | Ma | H01R 4/4836 |
| | | | 439/837 |
| 2008/0289681 A1 | 11/2008 | Adriani et al. | |
| 2008/0314432 A1 | 12/2008 | Paulson et al. | |
| 2009/0078299 A1 | 3/2009 | Cinnamon et al. | |
| 2009/0084432 A1 | 4/2009 | Kosmehl | |
| 2009/0114261 A1 | 5/2009 | Stancel et al. | |
| 2009/0126782 A1 | 5/2009 | Krause et al. | |
| 2009/0145746 A1 | 6/2009 | Hollars | |
| 2009/0215304 A1 | 8/2009 | Faust et al. | |
| 2010/0018135 A1 | 1/2010 | Croft et al. | |
| 2010/0144170 A1 | 6/2010 | Maebashi et al. | |
| 2010/0146878 A1 | 6/2010 | Koch et al. | |
| 2010/0275976 A1 | 11/2010 | Rubin et al. | |
| 2010/0326498 A1 | 12/2010 | Corneille et al. | |
| 2011/0048507 A1 | 3/2011 | Livsey et al. | |
| 2011/0114149 A1 * | 5/2011 | Li | H02S 40/34 |
| | | | 136/244 |
| 2011/0139288 A1 | 6/2011 | Rushlander et al. | |
| 2011/0146792 A1 | 6/2011 | Wu et al. | |
| 2011/0183540 A1 | 7/2011 | Keenihan et al. | |
| 2011/0220180 A1 | 9/2011 | Cinnamon et al. | |
| 2011/0232963 A1 | 9/2011 | Kono et al. | |
| 2011/0277811 A1 | 11/2011 | Corneille et al. | |
| 2012/0151721 A1 * | 6/2012 | Lin | B25B 5/06 |
| | | | 24/457 |
| 2012/0152349 A1 | 6/2012 | Cao et al. | |
| 2012/0291845 A1 | 11/2012 | Hatakeyama et al. | |
| 2013/0118558 A1 | 5/2013 | Sherman | |
| 2013/0169056 A1 | 7/2013 | Sherman et al. | |
| 2014/0158201 A1 | 6/2014 | Aitken | |
| 2014/0168927 A1 * | 6/2014 | Morris | H02S 40/34 |
| | | | 361/807 |
| 2014/0305493 A1 | 10/2014 | Dhir et al. | |
| 2014/0305494 A1 | 10/2014 | Dhir | |
| 2014/0305495 A1 | 10/2014 | Krajewski | |
| 2016/0027944 A1 | 1/2016 | Corneille et al. | |

FOREIGN PATENT DOCUMENTS

| | | |
|---|---|---|
| WO | 2009/137348 | 11/2009 |
| WO | 2009/137351 | 11/2009 |
| WO | 2009/137352 | 11/2009 |
| WO | 2009/137353 | 11/2009 |
| WO | 2010/014941 | 2/2010 |

OTHER PUBLICATIONS

U.S. Appl. No. 13/046,461, Office Action dated Apr. 9, 2013.
U.S. Appl. No. 13/046,461, Final Office Action dated Oct. 8, 2013.
U.S. Appl. No. 13/046,461, Office Action dated Sep. 19, 2013.
U.S. Appl. No. 13/046,461, Final Office Action dated Jul. 10, 2014.
U.S. Appl. No. 13/298,178, Office Action dated May 23, 2014.
U.S. Appl. No. 13/046,461, Office Action dated Sep. 3, 2014.
U.S. Appl. No. 13/046,461, Notice of Allowance dated Apr. 13, 2015.
U.S. Appl. No. 13/046,461, Notice of Allowance dated Aug. 26, 2015.
U.S. Appl. No. 13/298,178, Final Office Action dated Feb. 20, 2015.
U.S. Appl. No. 13/345,040, Notice of Allowance dated Apr. 24, 2013.
U.S. Appl. No. 14/806,537, Notice of Allowance dated Jul. 3, 2017.
U.S. Appl. No. 13/298,178, Office Action dated Dec. 22, 2015.
U.S. Appl. No. 13/298,178, Notice of Allowance dated Oct. 4, 2016.
U.S. Appl. No. 14/806,537, Notice of Allowance dated Nov. 27, 2017.
U.S. Appl. No. 13/345,040, Notice of Allowance dated Aug. 20, 2013.
Office Action dated Jul. 14, 2015, issued in U.S. Appl. No. 14/252,246.
Final Office Action dated Mar. 30, 2016, issued in U.S. Appl. No. 14/252,246.
Office Action dated Oct. 25, 2016, issued in U.S. Appl. No. 14/252,246.
Notice of Allowance dated Apr. 13, 2017, issued in U.S. Appl. No. 14/252,246.
Office Action dated Apr. 8, 2016, issued in U.S. Appl. No. 14/252,282.
Final Office Action dated Jan. 6, 2017, issued in U.S. Appl. No. 14/252,282.
Office Action dated Aug. 12, 2016, issued in U.S. Appl. No. 14/252,321.
Final Office Action dated May 1, 2017, issued in U.S. Appl. No. 14/252,321.
Aitken et al. U.S. Appl. No. 61/515,042 (2011).
Notice of Allowance dated Aug. 30, 2017, issued in U.S. Appl. No. 14/252,321.
U.S. Appl. No. 13/042,320, filed Mar. 7, 2011, Meyers.
U.S. Appl. No. 13/046,453, filed Mar. 11, 2011, Sherman et al.

(56) References Cited

OTHER PUBLICATIONS

U.S. Appl. No. 15/939,655, filed Mar. 29, 2018, Corneille et. al.
U.S. Appl. No. 13/042,320, Office Action dated Jul. 26, 2012.
U.S. Appl. No. 13/046,453, Office Action dated Jan. 9, 2012.
U.S. Appl. No. 13/046,453, Final Office Action dated May 18, 2012.

* cited by examiner

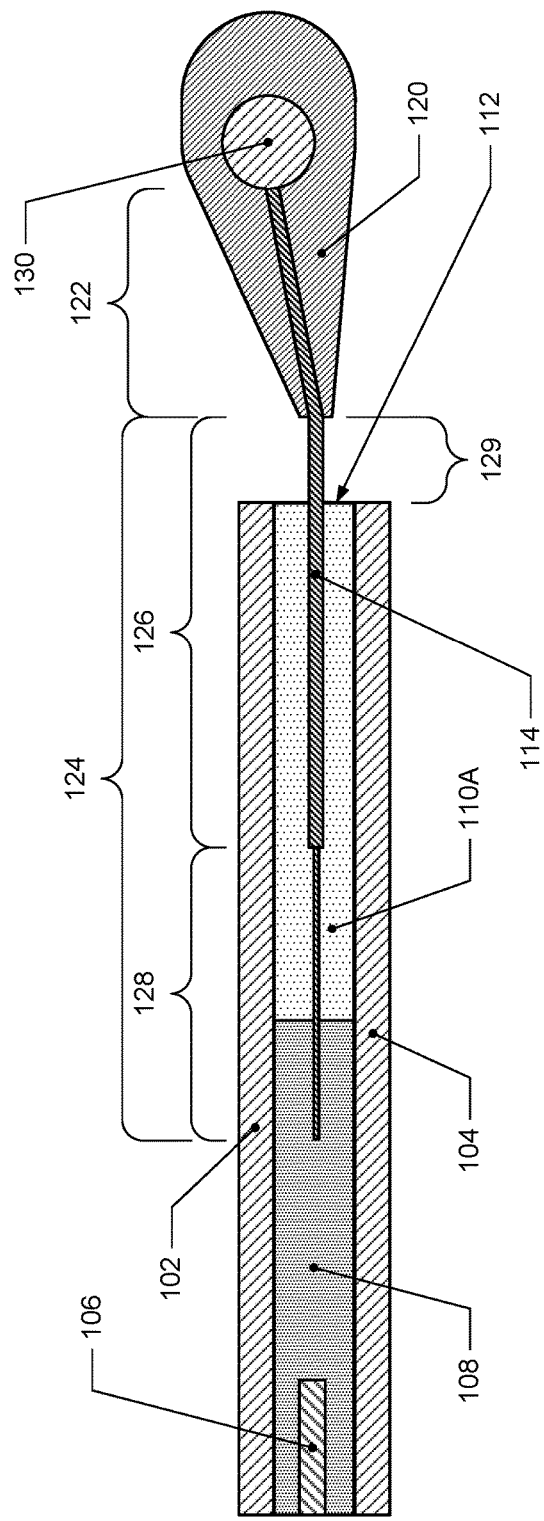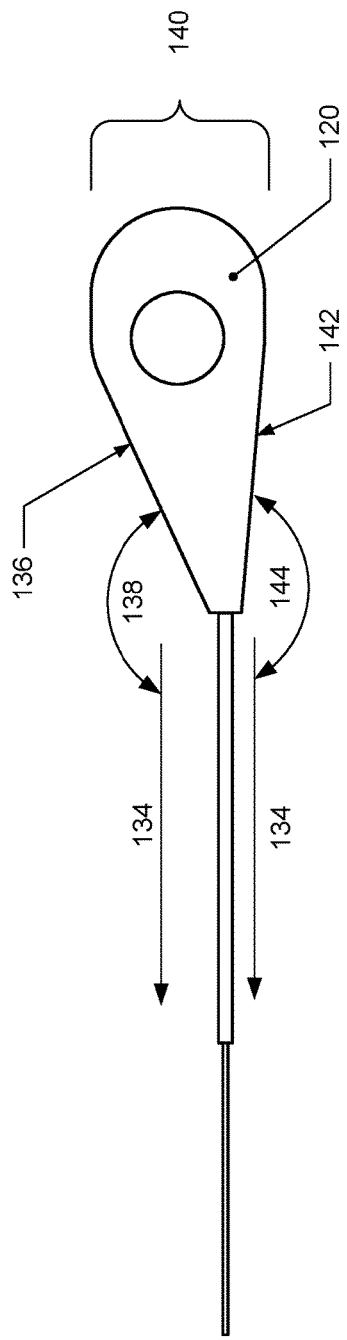
Figure 2
Figure 3

MODULE CONNECTOR FOR FLEXIBLE PHOTOVOLTAIC MODULE

BACKGROUND

Photovoltaic technology is being rapidly adopted to generate electricity from solar energy, both for local use and for supplying power to electrical grids. Photovoltaic systems may be implemented on structures, such as buildings and houses. In addition, light weight photovoltaic modules are now being adopted for transportation applications such as trucks, cars, boats, etc. Photovoltaic cells are the basic units of such systems. One or more photovoltaic cells are typically arranged into a photovoltaic module, which may be then used to form a photovoltaic array.

SUMMARY

In one embodiment, an apparatus may be provided. The apparatus may include a module connector for a flexible photovoltaic module, the flexible photovoltaic module may have a first sheet, a second sheet, one or more flexible photovoltaic cells positioned in a sealed space between the first sheet and the second sheet, and a seal region that spans between a first section of the first sheet and a second section of the second sheet and that forms a part of an exterior edge surface of the flexible photovoltaic module and. The module connector may include an insert that is configured to be inserted into a clamp and that includes an insert body, an electrical lead with a first portion that extends into and is sealed inside the insert body, and a second portion outside the insert body that extends away from the insert body in a first direction, and a cable with a first portion that extends into and is sealed inside the insert body, and a second portion outside the insert body that extends away from the insert body in a second direction. The electrical lead and the cable may be electrically coupled to each other inside the insert body. The clamp may include a body portion that has a recess configured to receive the insert body, a first clamping portion that is configured to clamp the second portion of the cable to connect the cable to the body portion, and a second clamping portion that has a first clamping surface configured to contact the first sheet and a second clamping surface configured to contact the second sheet, and that is configured to connect the clamp to the flexible photovoltaic module such that the clamp overlaps and extends around a part of the first sheet, a part of the exterior edge surface, and a part of the second sheet.

In some embodiments, the insert may further include a second electrical lead with a first portion that extends into and is sealed inside the insert body, and a second portion outside the insert body that extends away from the insert body in the first direction, and a second cable with a first portion that extends into and is sealed inside the insert body, and a second portion outside the insert body that extends away from the insert body in the second direction. The second electrical lead and the second cable may be electrically coupled to each other inside the insert body. The claim may further include a third clamping portion that is configured to clamp the second portion of the second cable to connect the second cable to the body portion.

In some embodiments, the apparatus may further include the flexible photovoltaic module. The second portion of the electrical lead may extend through the seal region and into the sealed space, and the electrical lead may be electrically connected to at least one of the flexible photovoltaic cells.

In some such embodiments, the insert may be positioned within the recess of the body portion of the clamp, the first clamping portion may be clamping the second portion of the cable such that the cable is connected to the body portion, the first surface may be contacting the first sheet, the second surface may be contacting the second sheet, the clamp may overlap and extends around the part of the first sheet, the part of the exterior edge surface, and the part of the second sheet, and the clamp may be connected to the flexible photovoltaic module.

In some further such embodiments, the clamp may be connected to the flexible photovoltaic module by an attachment means that extends through at least the body portion, the first sheet, the seal region, and the second clamping portion.

In some embodiments, the second clamping portion of the clamp may be configured to be moveable such that the first surface and the second surface face each other and are offset from each other.

In some embodiments, the first surface may be located on the body portion, the clamp may further include a flap that is connected to the body portion and that is configured to be moveable with respect to the body portion, and the second surface may be located on the flap.

In some such embodiments, the clamp further includes a flexible connector that may flexibly connect the flap to the body portion.

In some further such embodiments, the body portion, the flap, and the flexible connector may be a unitary body.

In some embodiments, the first clamping surface and the second clamping surface may be planar surfaces.

In some embodiments, the first direction may be orthogonal to the second direction.

In some embodiments, the first direction may be parallel to the second direction.

In some embodiments, the insert body may include a first planar exterior surface and a second planar exterior surface, the first planar exterior surface may be at an angle of between about 140 to about 180 degrees from the first direction, and the second planar exterior surface may be at an angle of between about 140 to about 180 degrees from the first direction.

In one embodiment, a flexible photovoltaic module may be provided. The flexible photovoltaic module may include a first sheet, a second sheet, one or more flexible photovoltaic cells positioned in a sealed space between the first sheet and the second sheet, a seal region that spans between a first section of the first sheet and a second section of the second sheet and that forms a part of an exterior edge surface of the flexible photovoltaic module, a module connector having an insert body, a first electrical lead having a first portion and a second portion, a first cable having a first portion and a second portion, and a clamp having a body portion with a recess configured to receive the insert body, a first clamping portion, and a second clamping portion. The insert body may be configured to be inserted into the clamp, the first portion of the first electrical lead may extend into and be sealed inside the insert body, the second portion of the first electrical lead may be outside the insert body, may extend away from the insert body in a first direction, may extend through the seal region and into the sealed space, and may be electrically connected to at least one of the flexible photovoltaic cells. The first portion of the first cable may extend into and may be sealed inside the insert body, may be outside the insert body, may extend away from the insert body in a second direction, and may be electrically coupled to the electrical lead inside the insert body. The first clamping portion may be configured to clamp the second portion of the first cable to connect the first cable to the body portion, and the second clamping portion may have a first surface configured to contact the first sheet, a second surface configured to contact the second sheet, and may be configured to connect the clamp to the flexible photovoltaic module such that the clamp overlaps and extends around a part of first sheet, a part of the exterior edge surface, and a part of the second sheet.

In some embodiments, the insert may be positioned within the recess of the body portion of the clamp, the first clamping portion may be clamping the second portion of the first cable such that the first cable is connected to the body portion, the first surface may be contacting the first sheet, the second surface may be contacting the second sheet, the clamp may overlap and extend around the part of first sheet, the part of the exterior edge surface, and the part of the second sheet, and the clamp may be connected to the flexible photovoltaic module.

In some such embodiments, the clamp may be connected to the flexible photovoltaic module by an attachment means that extends through the body portion, the first sheet, the seal region, and the second clamping portion.

In some embodiments, the apparatus may further include a second electrical lead with a first portion that extends into and is sealed inside the insert body, and a second portion outside the insert body that extends away from the insert body in the first direction, and a second cable with a first portion that extends into and is sealed inside the insert body, and a second portion outside the insert body that extends away from the insert body in the second direction. The second electrical lead and the second cable may be electrically coupled to each other inside the insert body, and the clamp may further include a third clamping portion that may be configured to clamp the second portion of the second cable to connect the second cable to the body portion.

In some such embodiments, the insert may be positioned within the recess of the body portion of the clamp, the first clamping portion may be clamping the second portion of the first cable such that the first cable is connected to the body portion, the third clamping portion may be clamping the second portion of the second cable such that the second cable is connected to the body portion, the first surface may be contacting the first sheet, the second surface may be contacting the second sheet, the clamp may overlap and extend around the part of first sheet, the part of the exterior edge surface, and the part of the second sheet, and the clamp may be connected to the flexible photovoltaic module.

In some further such embodiments, the first direction may be orthogonal to the second direction.

In some other further such embodiments, the first direction may be parallel to the second direction.

In one embodiment, a module connector for a flexible photovoltaic module may be provided. The module connector may include an insert that may be configured to be inserted into a clamp and that may include an insert body, a first electrical lead with a first portion that extends into and is sealed inside the insert body, and a second portion outside the insert body that extends away from the insert body in a first direction, and a first cable with a first portion that extends into and is sealed inside the insert body, and a second portion outside the insert body that extends away from the insert body in a second direction. The first electrical lead and the first cable may be electrically coupled to each other inside the insert body. The module connector may also include a clamp that includes a body portion that has a recess configured to receive the insert body, a first clamping portion that is configured to clamp the second portion of the first cable to connect the first cable to the body portion, and a second clamping portion that has a first surface and a second surface. The second clamping portion may be configured to be moveable such that the first surface and the second surface face each other and are offset from each other.

In some embodiments, the second clamping portion may be further configured to be moveable such that the first surface and the second surface are parallel to each other.

In some embodiments, the first surface may be located on the body portion, the clamp may further include a flap that is connected to the body portion and that is configured to be moveable with respect to the body portion, and the second surface may be located on the flap.

In some such embodiments, the clamp may further include a flexible connector that flexibly connects the flap to the body portion.

In some further such embodiments, the body portion, the flap, and the flexible connector may be a unitary body.

In some embodiments, the first clamping portion may include a clamping member configured to be moveable between an open position and a closed position, in the open position, the first clamping portion may be configured such that the first cable is insertable into the first clamping portion, and in the closed position, the clamping member may be configured to contact the first cable, to connect to the body portion, and to connect the first cable to the body portion.

In some embodiments, the first clamping portion may include a crimping portion that is configured to crimp the first cable.

In some embodiments, the insert may further include a second electrical lead with a first portion that extends into and is sealed inside the insert body, and a second portion outside the insert body that extends away from the insert body in the first direction, and a second cable with a first portion that extends into and is sealed inside the insert body, and a second portion outside the insert body that extends away from the insert body in the second direction, the second electrical lead and the second cable may be electrically coupled to each other inside the insert body. The clamp may also further includes a third clamping portion that is configured to clamp the second portion of the second cable to connect the second cable to the body portion.

In some such embodiments, the insert may be positioned within the recess of the body portion of the clamp, the first clamping portion may be clamping the second portion of the first cable such that the first cable is connected to the body portion, and the third clamping portion may be clamping the second portion of the second cable such that the second cable is connected to the body portion.

In some embodiments, the first direction may be orthogonal to the second direction.

In some embodiments, the first direction may be parallel to the second direction.

In some embodiments, the first surface of the second clamping portion may have a first part and a second part that are offset from and coplanar with each other.

In some embodiments, the insert body may include a first planar exterior surface and a second planar exterior surface, the first planar exterior surface may be at an angle of between about 140 degrees to about 180 degrees from the first direction, and the second planar exterior surface may be at an angle of between about 140 degrees to about 180 degrees from the first direction.

In one embodiment, an apparatus may be provided. The apparatus may include a module connector for a flexible photovoltaic module. The flexible photovoltaic module may have a first sheet, a second sheet, one or more flexible photovoltaic cells positioned in a sealed space between the first sheet and the second sheet, and a seal region that spans between a first section of the first sheet and a second section of the second sheet and that forms a part of an exterior edge surface of the flexible photovoltaic module and. The module connector may include an insert that is configured to be inserted into a clamp and that includes an insert body, an electrical lead with a first portion that extends into and is sealed inside the insert body, and a second portion outside the insert body that extends away from the insert body in a first direction, a cable with a first portion that extends into and is sealed inside the insert body, and a second portion outside the insert body that extends away from the insert body in a second direction. The electrical lead and the cable may be electrically coupled to each other inside the insert body, and a first section of a first clamping portion; the first clamping portion may include the first section and a second section; and the first clamping portion may be configured to clamp the second portion of the cable to connect the cable to the body portion. The clamp may include a body portion that has a recess configured to receive the insert body, the second section of the first clamping portion, and a second clamping portion that has a first clamping surface configured to contact the first sheet and a second clamping surface configured to contact the second sheet, and that is configured to connect the clamp to the flexible photovoltaic module such that the clamp overlaps and extends around a part of the first sheet, a part of the exterior edge surface, and a part of the second sheet.

In one embodiment, an apparatus may be provided. The apparatus may include a module connector for a flexible photovoltaic module, the module connector being a monolithic unit and including a first body portion that is flexibly attached to a second body portion, and a recess in the first body portion. The recess may be configured to receive an insert of the flexible photovoltaic module and to secure the insert to the module connector, and the module connector may be configured to be positioned on the flexible photovoltaic module such that it simultaneously contacts a top side of the flexible photovoltaic module, a bottom side of the flexible photovoltaic module, and wraps around an edge of the flexible photovoltaic module.

In some embodiments, the apparatus may further include the flexible photovoltaic module. The insert may be positioned in the recess and secured by the module connector, and the module connector may be positioned on the flexible photovoltaic module such that it simultaneously contacts the top side of the flexible photovoltaic module, the bottom side of the flexible photovoltaic module, and wraps around the edge of the flexible photovoltaic module.

BRIEF DESCRIPTION OF THE DRAWINGS

FIG. 2 depicts a cross-sectional detail view of the example flexible photovoltaic module of FIG. 1.

FIG. 3 depicts a side view of an insert of a module connector.

DETAILED DESCRIPTION

Figure 1:
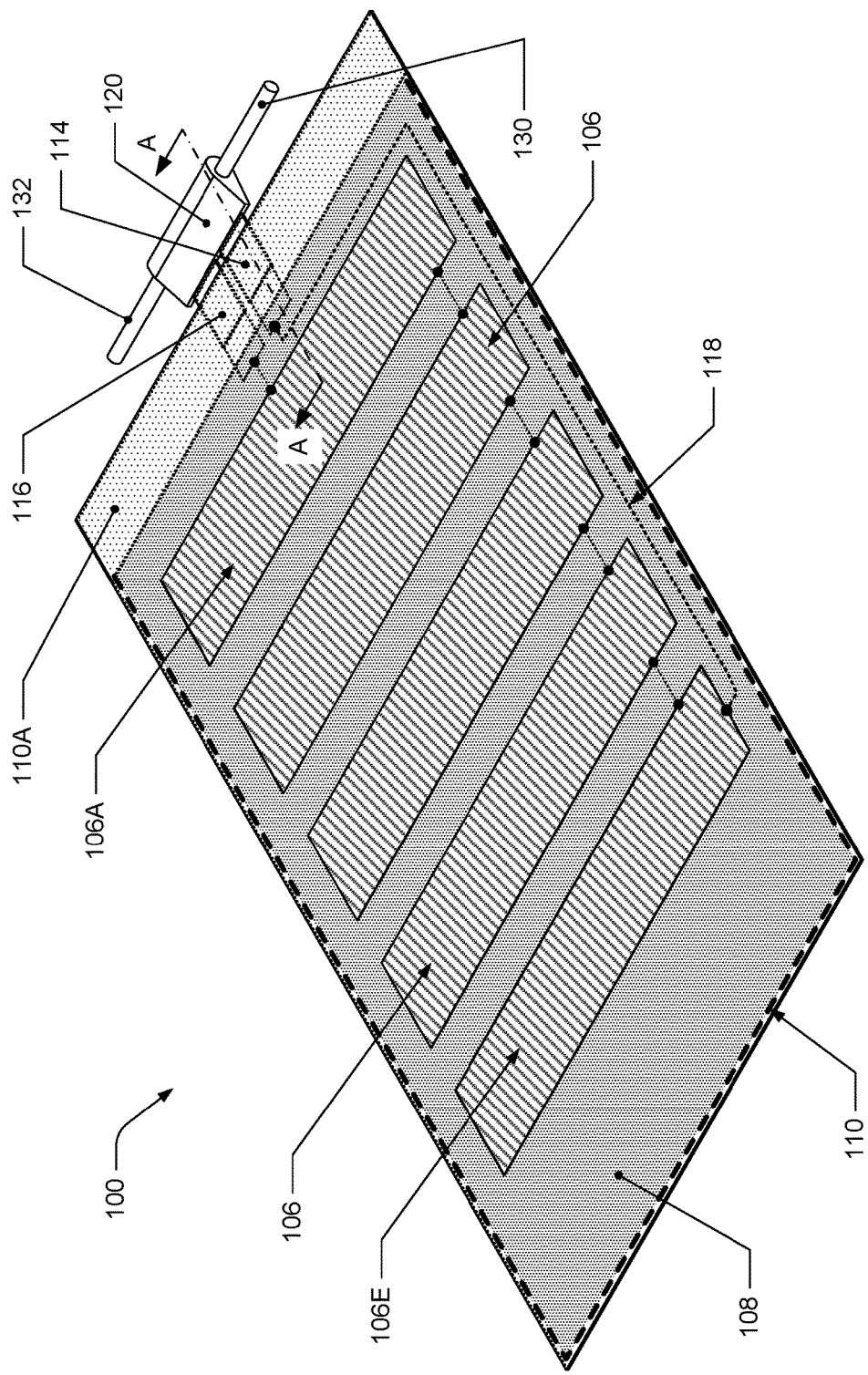
FIG. 1 depicts an isometric view of an example flexible photovoltaic module.

Flexible photovoltaic modules (referred to herein as "modules") are made from flexible components including flexible sealing sheets and flexible photovoltaic cells. Use of these flexible components allows these modules to bend during handling and installation. These modules may be installed on surfaces that are not perfectly flat and may have some vertical surface variations. For example, flexible modules may be installed on commercial building rooftops. Such rooftops are substantially horizontal but may have topographical variations such as surface bumps and even small vertical steps.

During installation of a photovoltaic array, a flexible photovoltaic module is electrically connected to other modules and other electrical components of the photovoltaic array, such as return lines, inverters, and the like. To form these connections, a flexible photovoltaic module may have one or more electrical connectors that are accessed during installation to connect with components external to the module, such as electrical connectors of adjacent modules. A module's electrical connectors include electrically conductive elements, such as a metallic wire. As it is accessible during installation, a metallic wire may be provided in an electrically insulated casing as a cable. An electrical connector may also include, or may be configured to make electrical connections to, standard MC4 photovoltaic connectors or other types of external photovoltaic connectors. For example, a module may have a cable connected to a photovoltaic connector that is electrically connected to the photovoltaic cells such that electricity generated by the cells can be transported to the cable, the photovoltaic connector and to an external electrical connection, such as another module.

The one or more electrical connectors of a flexible photovoltaic module may be electrically connected to the photovoltaic cells that are sealed inside the module and to return lines provided within the module that typically extend along or across the module. The one or more electrical connectors may be electrically connected to the photovoltaic cells by electrical leads. An electrical lead may have a portion that extends into the sealed space of the module, which may include extending through an edge seal of the module. Electrical leads may be in the form of thin but sufficiently conductive metal strips, which are sometimes referred to as bus bars because of their flat aspect ratios (i.e., their heights being substantially smaller (e.g., less than 10%) than their widths). In some of the embodiments disclosed herein, the height of an electrical lead may be 0.1 millimeters or 0.125 millimeters, while the width may be 12 mm.

An electrical lead may be positioned within a module during manufacturing such that one portion of an electrical lead is located within a sealed space of the module with another portion extending through and outside the sealed space so that it may electrically connect with an electrical connector. During the installation and use of the module, physical stresses may be exerted on an electrical lead, or on an electrical connector that is connected to that electrical lead that may adversely affect the module, including the electrical leads and the seal of the module where the electrical leads are located. Accordingly, as discussed below some embodiments of the present disclosure include a module connector that is configured to reduce such physical stresses and their adverse effects.

Additionally, during the manufacture or installation of some traditional flexible photovoltaic modules, the attachment of electrical connectors to the module requires potting or adhesives to achieve and safe and reliable connections. Some typical connections between an electrical connector and a module may require multiple process steps after manufacturing the module thereby increasing time, materials, cost, as well as increasing potential areas for failure or problems. For example, electrical components may need to be soldered together, which presents a potential risk of failure of the soldered connection, as well as additional time and materials. Some traditional junction boxes may also require potting and priming, which again introduces potential failure areas as well as requires additional time and materials. Also, having a module connector adhered to a module before installation of that module at a location may make the installation of that module more challenging and time consuming. As discussed below, some embodiments of the present disclosure include a module connector that avoids these problems with traditional module connectors.

FIG. 1 depicts an isometric view of an example flexible photovoltaic module and FIG. 2 depicts a cross-sectional detail view of the example flexible photovoltaic module of FIG. 1. The example flexible photovoltaic module 100 (referred to herein as "module 100") includes a first sheet 102, a second sheet 104, and five flexible photovoltaic cells 106. The first sheet 102 is a flexible sheet that may be considered a top, light-facing sheet and the second sheet 104 is also a flexible sheet that may be considered a bottom sheet (these sheets are identified in FIG. 2). The module also includes a sealed space 108, identified in dark shading, between the first sheet 102 and the second sheet 104. This sealed space 108 may be considered a plenum that is bounded, at least in part, by the first sheet 102, the second sheet 104, and an edge seal 110. The edge seal 110 may extend along one or more edges of, and may span between, the first sheet 102 and the second sheet 104; it may also form a portion of the exterior surface of the module 100.

In FIG. 1, the five flexible photovoltaic cells 106 are seen within the sealed space 108 and electrically connected to each other as represented by a dotted line between each cell. It is to be understood that these flexible photovoltaic cells 106 may be interconnected by various ways known in the art, and also may be physically overlapping. The edge seal 110 is represented by dashed lines for illustration purposes and is seen extending along at least a part of three edges of the first sheet 102 and the second sheet 104. For purposes of illustration only, the edge seal 110 is depicted such that it is offset from the first and second sheets 102 and 104; however, it is understood that the edge seal 110 may also form a portion of the exterior surface of the module 100 as well as define a boundary of the sealed space 108. The edge seal 110 may also include a seal region 110A, depicted with light shading, that may occupy a larger surface area than other regions of the edge seal 110.

FIG. 2 is a partial section view of the module 100 of FIG. 1 that is taken along section line A-A. Here, the first sheet 102 and the second sheet 104 can be seen vertically offset from each other, the sealed space 108 is located between the first and second sheets 102 and 104, and a part of one of the flexible photovoltaic cells 106 is shown within the sealed space 108. As seen in FIG. 2, the seal region 110A spans a first section of the first sheet 102 and a second section of the second sheet 104 and forms a part of an exterior edge surface 112 of the module 100. Here, the first sheet 102 and the second sheet 102 are substantially the same size (e.g., same length and width) and are substantially aligned with each other. Substantially here means within +/−5%.

The flexible photovoltaic cells 106 may be any appropriate solar cells that can be flexed without damage. Examples of flexible photovoltaic cells include copper indium gallium selenide (CIGS) cells, cadmium-telluride (Cd—Te) cells, amorphous silicon (a-Si) cells, micro-crystalline silicon (Si) cells, crystalline silicon (c-Si) cells, gallium arsenide (GaAs) multi-junction cells, light adsorbing dye cells, organic polymer cells, and other types of photovoltaic cells. A photovoltaic cell typically has a photovoltaic layer that generates a voltage when exposed to light. The photovoltaic layer may be positioned adjacent to a back conductive layer, which, in certain embodiments, is a thin flexible layer of a metal such as molybdenum (Mo), niobium (Nb), copper (Cu), silver (Ag), and combinations and alloys thereof. The photovoltaic cell may also include a flexible conductive substrate, such as stainless steel foil, titanium foil, copper foil, aluminum foil, or beryllium foil. Another example includes a conductive oxide or metallic deposition over a polymer film, such as polyimide. In certain embodiments, a substrate has a thickness of between about 50 microns and 1,270 microns (e.g., about 254 microns), with other thicknesses also in the scope of the embodiments described herein. The photovoltaic cell may also include a top flexible conductive layer. This layer can include one or more transparent conductive oxides (TCO), such as zinc oxide, aluminum-doped zinc oxide (AZO), indium tin oxide (ITO), and gallium doped zinc oxide. A typical thickness of a top conductive layer is between about 100 nanometers and 1,000 nanometers or, more specifically, about 200 nanometers and 800 nanometers. As stated above, the flexible photovoltaic cells 106 may be interconnected, for example, by one or more wire networks (not depicted) which may extend over a front side of one cell as well as over a back side of another adjacent cell to interconnect these two cells in series. A photovoltaic module may include any number of flexible photovoltaic cells 106 in any appropriate arrangement.

The first and second sheets 102 and 104 may be sealing sheets that may include flexible materials, such as polyethylene, polyethylene terephthalate (PET), polypropylene, polybutylene, polybutylene terephthalate (PBT), PPO, polyphenylene sulfide (PPS) polystyrene, PC, ethylene-vinyl acetate (EVA), fluoropolymers (e.g., polyvinyl fluoride (PVF), polyvinylidene fluoride (PVDF), ethylene-terafluoethylene (ETFE), fluorinated ethylene-propylene (FEP), perfluoroalkoxy (PFA) and polychlorotrifluoroethane (PCTFE)), acrylics (e.g., poly(methyl methacrylate)), silicones (e.g., silicone polyesters), and/or PVC, as well as multilayer laminates and co-extrusions of these materials. A typical thickness of a sealing sheet is between about 125 microns and 2,540 microns or, more specifically, between about 254 microns and 1,270 microns, though other thicknesses may be used as well. In certain embodiments, a flexible sealing sheet includes a metallized layer to improve its water permeability characteristics. For example, a metal foil may be positioned in between two insulating layers to form a composite flexible sealing sheet.

In certain embodiments, the first sheet 102 may be made from material that is different than a material of the second sheet 104, and the first and second sheets 102 and 104 may be of different thicknesses from each other. In some embodiments, these sheets may have a thickness less than 2,032 microns or, more specifically, less than 1,016 microns or even less than 508 microns.

In certain embodiments, the module 100 may have an encapsulant layer positioned in between the first sheet 102 and the flexible photovoltaic cells 106, as well as another encapsulant layer between the second sheet 104 and the flexible photovoltaic cells 106. Examples of encapsulant layer materials include non-olefin thermoplastic polymers or TPO, such as polyethylene (e.g., a linear low density polyethylene), polypropylene, polybutylene, PET, PBT, polystyrene, polycarbonates, fluoropolymers, acrylics, ionomers, silicones, and combinations thereof.

As noted above, the module 100 may include the edge seal 110 (including the seal region 110A) that surrounds and seals the flexible photovoltaic cells 106 together with the first sheet 102 and the second sheet 104, as well as with other components. The edge seal 110 may prevent moisture from penetrating towards the flexible photovoltaic cells 106. The edge seal 110 may be made from certain organic or inorganic materials that have low inherent water vapor transmission rates. In certain embodiments, the edge seal 110 is configured to absorb moisture from inside the module in addition to protecting the module 100 from moisture ingression. For example, a butyl-rubber containing moisture getter or desiccant may be added to the edge seal 110. In certain embodiments, a portion of the edge seal 110 that contacts electrical components (e.g., bus bars, diodes, return lines) of module 100 is made from a thermally resistant polymeric material; this portion of the edge seal 110 may be the seal region 110A. The edge seal 110 may also secure first sheet 102 with respect to second sheet 104. In certain embodiments, the edge seal 110 determines at least some of the boundaries of the sealed space 108.

In some embodiments, the module 100 may be manufactured using one or more lamination procedures in which aspects of the module 100 may be heated and pressed. For example, the pressing may be performed by an inflatable bladder, and such lamination may heat the encapsulant and edge seal such that the sealed space 108 is formed in the module 100.

A module connector of a flexible photovoltaic module described herein may have multiple parts that are configured to be assembled together and attached to the module. For instance, the module connector may include an insert and a clamp; the insert may have an electrical lead electrically connected to a photovoltaic cell of the module and an electrical cable, and the insert may be configured to be inserted into the clamp; the clamp may be configured to clamp the cable to a body portion of the clamp and to connect the clamp body to the module.

In some embodiments, the electrical leads of the module may be positioned within the module 100 during the manufacturing of the module 100 such that at least the edge seal 110 creates a seal around portions of the electrical leads. For instance, the module 100 of FIG. 1 includes a first electrical lead 114 and a second electrical lead 116 that are electrically connected to at least one of the flexible photovoltaic cells 106 of the module 100, as represented by the dotted line (not labeled). The first and second electrical leads 114 and 116 are electrically connected, either directly or indirectly (e.g., via a bus bar or return line), to the flexible photovoltaic cells 106. For instance, the second electrical lead 116 is electrically connected to one flexible photovoltaic cell 106A while the second electrical lead 114 is electrically connected to a bus bar 118 that is electrically connected to another flexible photovoltaic cell 106E.

Each electrical lead may have a section located within the body of the insert and another section located within the module. For example, as seen in FIGS. 1 and 2, a first portion of the first electrical lead 114 and a first portion of the second electrical lead 116 extend into and are sealed within an insert body 120. This seal of the electrical leads in the insert body 120 may be waterproof and may have an IP (i.e., international protection marking or ingress protection marking) of IP68, or may have a National Electrical Manufacturers Association (NEMA) enclosure rating of 6P. For instance, referring to FIG. 2, the first portion 122 of the first electrical lead 114 can be seen extending into the insert body 120. A second portion 124 of the first electrical lead 114 is outside the insert body 120 and extends through the seal region 110A and into the sealed space 108. The seal region 110A extends around a portion of each of the electrical leads 114 and 116 such that they are sealed within the seal region 110A and the sealed space 108 remains sealed.

In some embodiments, like that seen in FIG. 2, a third portion 126 of the first electrical lead 114 may be clad with electrical insulation material while a fourth portion 128 of the first electrical lead 114 may not have be clad with any electrical insulation and may instead be an exposed electrical element, such as a bare wire, within the material of the seal region 110A and the seal spaced 108. An example insulation material may be a Kapton® polyimide. This fourth portion 128 of the first electrical lead 114 may be located in both the sealed space 108 and the seal region 110A. Having a partially insulated electrical lead within the seal region may help retain the moisture seal of the seal region. The second electrical lead 116 may be similarly configured.

As stated above, the module includes one or more electrical connectors that are configured to electrically connect to components that are external to the module, such as electrical connectors of adjacent modules. The electrical connectors may also include, or may be configured to make electrical connections to, standard MC4 photovoltaic connectors or other types of external photovoltaic connectors. The module 100 of FIG. 1 includes at least two such electrical connectors, which are depicted as a first cable 130 and a second cable 132. The first cable 130 includes a first portion that extends into and is sealed inside the insert body 120 and a second portion that is outside and extends away from the insert body 120; the second cable 132 also includes a first portion that extends into and is sealed inside the insert body 120 and a second portion 126 that is outside and extends away from the insert body 120. The sealing of the first and second cables 130 and 132 in the insert body 120 is done in the same manner as described above with respect to the electrical leads and the insert body 120. Additionally, the first electrical lead 114 is electrically coupled to the first cable 130 inside the insert body 120 and the second electrical lead 116 is electrically coupled to the second cable 132 inside the insert body 120. For instance, in FIG. 2, a part of the first portion of the first cable 130 inside the insert body 120 is electrically connected to the first portion 122 of the first electrical lead 114. The insert body may, in some embodiments, be overmolded around the first and second electrical leads and the first and second cables and may be made of a glass filled nylon. In some embodiments, an "insert" may be considered to include the insert body, the first and second cables, and the first and second electrical leads.

In some embodiments, the first and the second electrical leads 114 and 116 may extend away from the insert body in a first direction 134 like can be seen in FIG. 3, which depicts a side view of an insert of a module connector. As can also be seen in FIG. 3, the insert body 120 may also include a first surface 136 that is angled with respect to the first direction 134 by a first angle 138. The insert may be configured such that it may be present during the manufacturing of the module and does not adversely affect the manufacturing processes. Such configuration may include the insert body being made of a material that is able to withstand the temperatures utilized during the manufacturing processes, such as between about 130° C. and about 170° C., and the insert body being shaped so that it does not interfere with the lamination process. For instance, the insert body may be offset from the module by a first offset distance 129 seen in FIG. 2, which may be, for instance, about 5 millimeters, and may have one or more angled surfaces and a height that allow a press (e.g., a diaphragm) to press uniformly on the module during a lamination process. An example diaphragm press is described in U.S. patent application Ser. No. 12/550,314, filed on Aug. 28, 2009 and titled "INTEGRATED FRAME FOR CONTROL OF VACUUM LAMINATION" which is hereby incorporated by reference in its entirety and for all purposes. In FIG. 3, the first angle 138 may be about _degrees and may range between about 140° and 180°, including about 155°. The height 140 of the insert body 120 may also be between about 6 millimeters to about 16 millimeters. In some embodiments, a second surface 142 of the insert body 120 may be angled with respect to the first direction 134 by a second angle 144, which may be between about 140° to about 180°.

Figure 4:
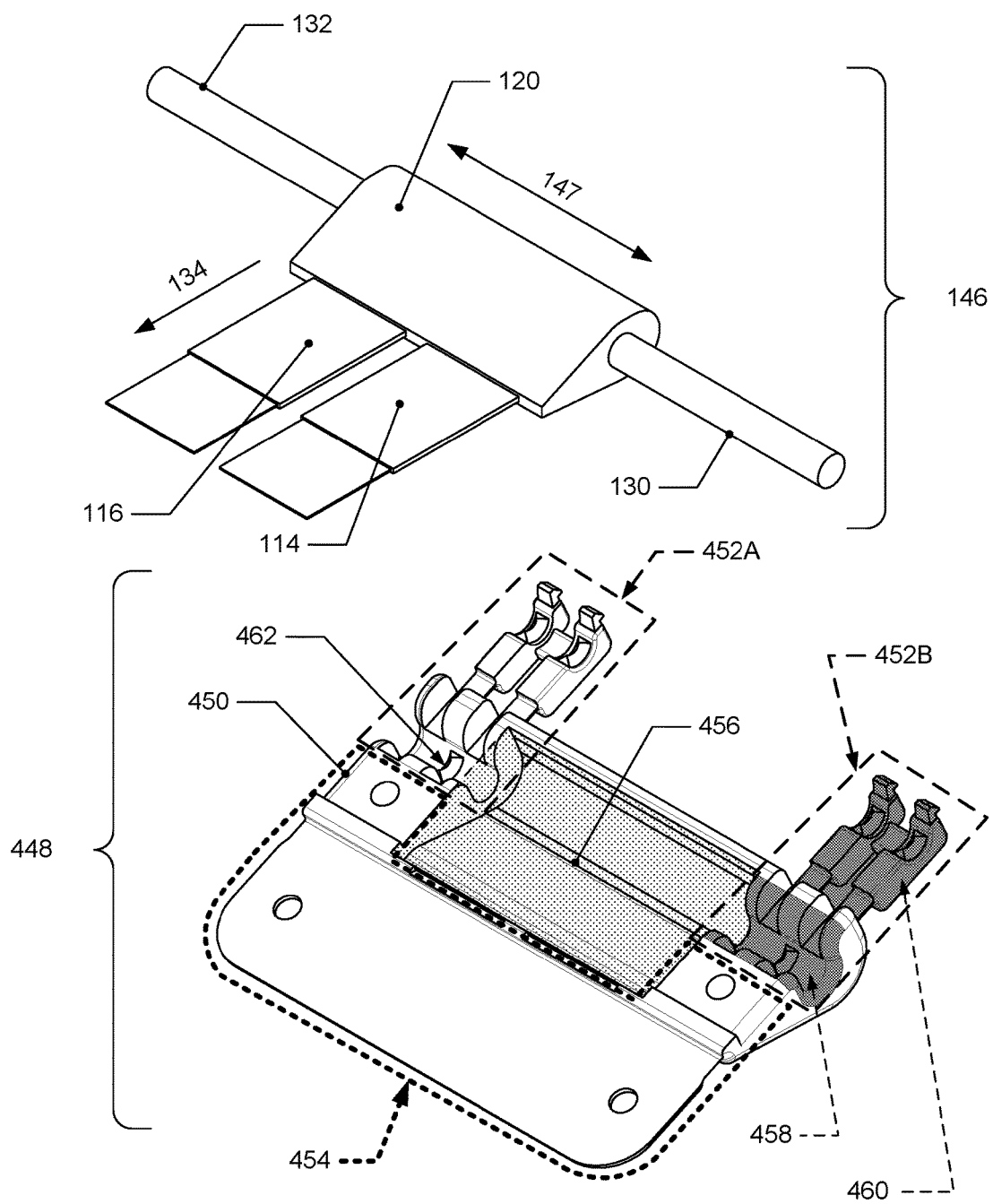
FIG. 4 depicts an isometric exploded view of a module connector that includes the insert of FIG. 1 and a clamp.

The cables of the insert may extend away from the insert body in a variety of directions. In some embodiments, the first cable 130 and the second cable 132 may extend away from the insert body 120 in opposite directions along a second axis that is perpendicular to the first direction 134, like depicted in FIG. 1. FIG. 4 depicts an isometric exploded view of a module connector that includes the insert of FIG. 1 and a clamp; the clamp is discussed below. As can be seen in FIG. 4, the insert 146 includes the insert body 120, the first electrical lead 114, the second electrical lead 116, the first cable 130, and the second cable 132. The first cable 130 extends away from the insert body 120 along the second axis 147 in one direction while the second cable extends away from the insert body 120 along the second axis 147 in an opposite direction. In some other embodiments, the first cable 130 and the second cable 132 may extend away from the insert body 120 along a second axis that is parallel to the first direction 134.

Embodiments of the clamp will now be discussed. As stated above, the clamp may be configured to connect at least one cable of the insert to the clamp body so that external forces (e.g., pushing or pulling) exerted on the cable are transferred to the clamp and not transferred to the insert body or to the electrical lead. This connection reduces or prevents the external forces from adversely affecting the cable, the insert, the electrical leads, the seal of the module, and the electrical connection between the electrical lead and the cable. The clamp may also be configured to connect the clamp body to the flexible photovoltaic module such that, in conjunction with the connection between the cable and the clamp body, external forces exerted on the cable are transferred to the module via the clamp. This connection also reduces or prevents the external forces from adversely affecting the edge seal, and the electrical and physical connections of the electrical lead to the module. For example, if a cable is pulled during the installation of a module, that pull force will be transferred to the clamp body and to the module itself, as opposed to being transferred to the electrical lead that may remove the electrical lead from the module, tear the module edge, or cause the electrical lead to disconnect from an internal electrical component.

The clamp 448 of FIG. 4 includes a body portion 450, a first clamping portion 452, and a second clamping portion 454. The body portion 450 includes a recess 456, identified with light shading, that is configured to receive the insert body 120 such that the insert body 120 can be inserted into the recess 456. The recess 456 may be shaped and sized such that it matches some of the exterior surfaces of the insert body 120 and it may have features configured to removably retain the insert body 120. For instance, the insert body 120 may be insertable into and removable from the recess 456. The clamp 448 includes two first clamping portions, 452A and 452B (452A may also be referred to as the first clamping portion while 452B may be referred to as a third clamping portion), which are generally located within the dashed boxes. Each first clamping portion is configured to clamp a cable such that the cable is connected to the body portion 450 of the clamp 448.

In some embodiments, each first clamping portion may have a cable insertion portion 458 and a clamping member 460 (both of which are shown in dark shading), with the cable insertion portion 458 configured to receive a cable (e.g., first cable 130) and the clamping member 460 configured to be moveable so that it may contact the cable and cause the cable to be clamped. In some such embodiments, the first clamping portion may be configured to be moveable between an open position and a closed position. In the open position, like depicted in FIG. 4, the first clamping portion is configured such that the cable is insertable into the first clamping portion. In the closed position, the clamping member 460 is configured to contact the cable, to connect to the body portion 450, and to connect the cable to the body portion 450, like discussed below and shown in FIG. 6.

Figure 5:
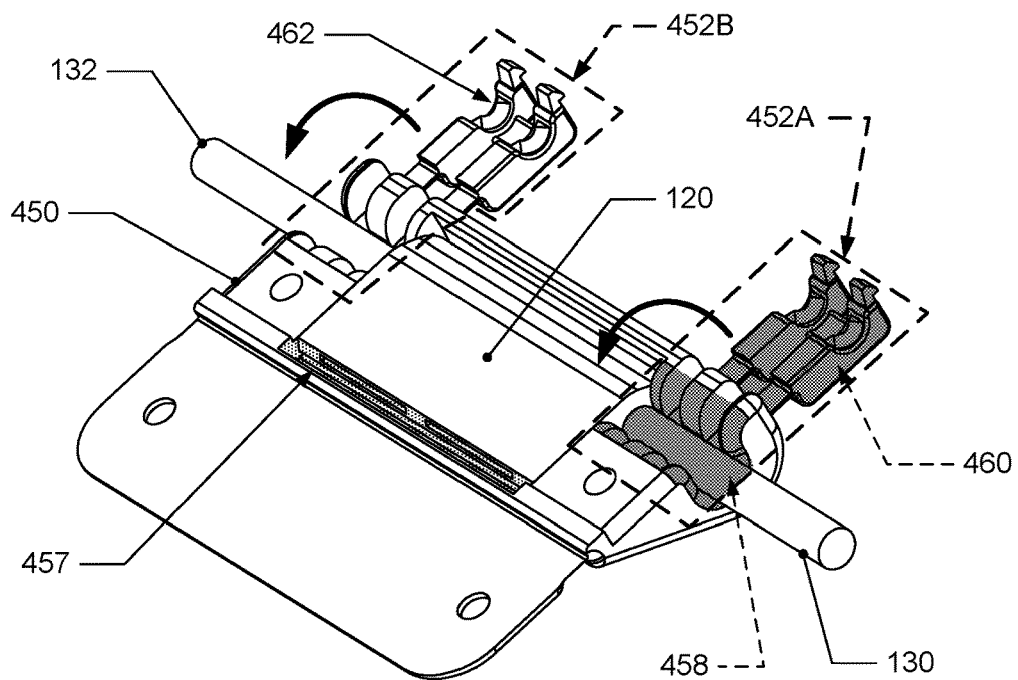
FIG. 5 depicts an isometric view of the module connector of FIG. 4 with the insert inserted into the clamp.

FIG. 5 depicts an isometric view of the module connector of FIG. 4 with the insert inserted into the clamp. The insert body 120 is positioned in the recess of the clamp 448, but the first and second electrical leads are not depicted for illustration purposes. As can also be seen, the second portion of the first cable 130 is positioned in the cable insertion portion 458 of the first clamping portion 452A and the second portion of the second cable 132 is similarly positioned in the first clamping portion 452B. Additionally, the arrows indicate the movement of the clamping members (e.g., clamping member 460) of the first clamping portions 452A and 452B to contact and clamp the first and second cables 130 and 132 to the body portion 450. The first clamping portions 452A and 452B may also include surface features that are configured to better clamp the cables, such as protrusions 462 that can be seen in FIGS. 4 and 5. The first clamping portions 452A and 452B may also be configured to crimp the cables. The first clamping portions may also include fastening features that are configured to retain the first clamping portions in place, such as snaps or clips. These features may also be configured to allow the release of the clamping members so the cable and insert may be removed from the clamp.

Figure 6:
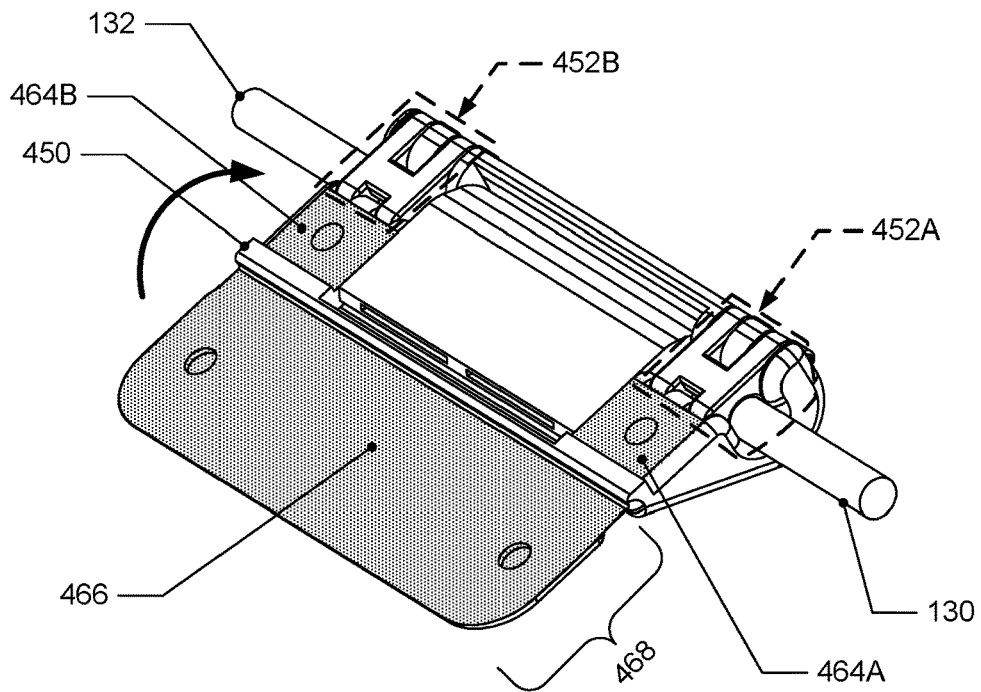
FIG. 6 depicts another isometric view of the module connector of FIG. 4.

FIG. 6 depicts another isometric view of the module connector of FIG. 4. Here, the first clamping portions 452A and 452B are each clamping the first and second cables 130 and 132, respectively. Each moveable portion has been moved such that it contacts the cable in its corresponding cable insertion portion 458 and is causing, at least in part, the cable to be connected to the body portion 450.

Turning to the second clamping portion 454, it can be seen generally located within the dotted shape in FIG. 4 and identified with light shading in FIG. 6. The second clamping portion 454 is configured to connect the clamp to the module such that the second clamping portion contacts both the first sheet 102 and the second sheet 104 of the module 100 and overlaps with and extends around parts of the first sheet 102, the exterior edge surface 112, and the second sheet 104. Referring to FIG. 6, the second clamping portion 454 may therefore include a first clamping surface (here the first clamping surface has two sections 464A and 464B that are offset from each other and coplanar with each other) that is configured to contact the first sheet 102 and a second clamping surface 466 that is configured to contact the second sheet 104. The second clamping surface 466 may be located on a moveable portion of the clamp, such as a flap 468 that is moveably connected to the body portion 450. In some embodiments, the clamp may include a flexible connector that flexibly, or movably, connects the flap to the body portion. In some such embodiments, the body portion, the flap, and the flexible connector may be a unitary, single body (i.e., a monolithic body or unit).

Figure 7:
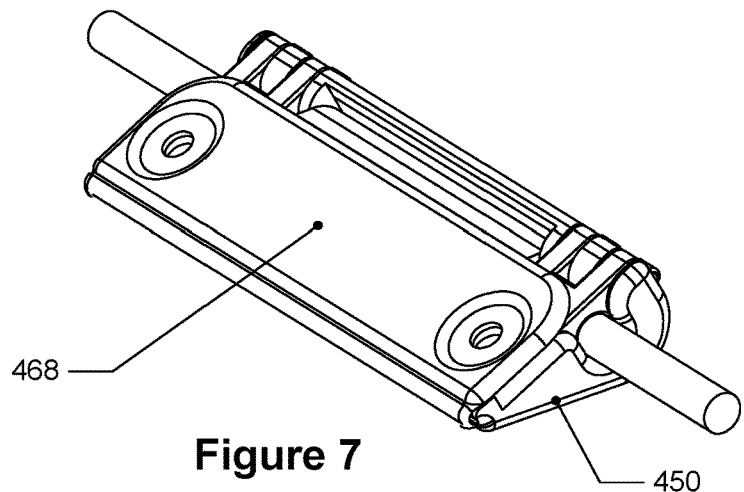
FIG. 7 depicts yet another isometric view of the module connector of FIG. 4.

Such moveable connection between the flap 468 and the body portion 450 enables them to be moveable with respect to each other, such as indicated by the arrow in FIG. 6, and in some embodiments, enables the first clamping surface 464A and 464B and the second clamping surface 466 to be facing each other, including being parallel to each other. FIG. 7 depicts yet another isometric view of the module connector of FIG. 4. Here, the flap 468 has been moved with respect to the body portion 450 such that the first clamping surface 464A and 464B and the second clamping surface 466 face each other, although such surfaces are not visible in this Figure.

Figure 8:
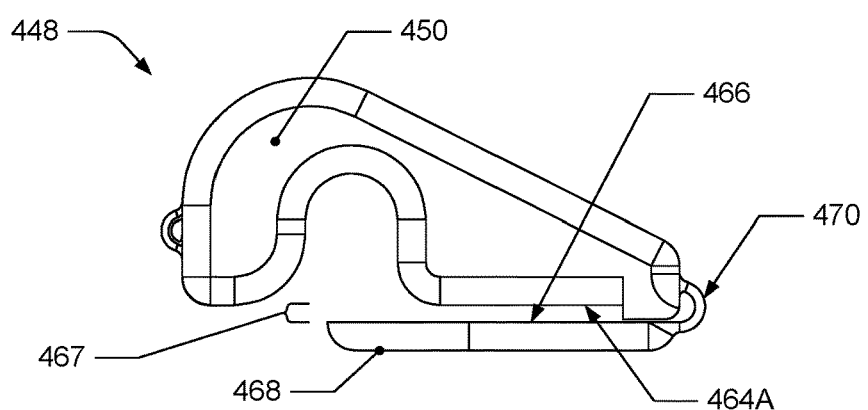
FIG. 8 depicts a side view of the clamp of FIG. 4.

FIG. 8 depicts a side view of the clamp of FIG. 4. As can be seen, the first clamping surface 464A and the second clamping surface 466 face each other, are parallel to each other, and are offset from each other by a first separation distance 467. This first separation distance may be substantially the same (e.g., within +/−5%) as the thickness of the module. In some embodiments, the first clamping surface and/or the second clamping surface may be planar surfaces. A flexible connector 470 can also be seen which flexibly connects (e.g., so that it is movably connected) the flap 468 to the body portion 450.

Figure 9:
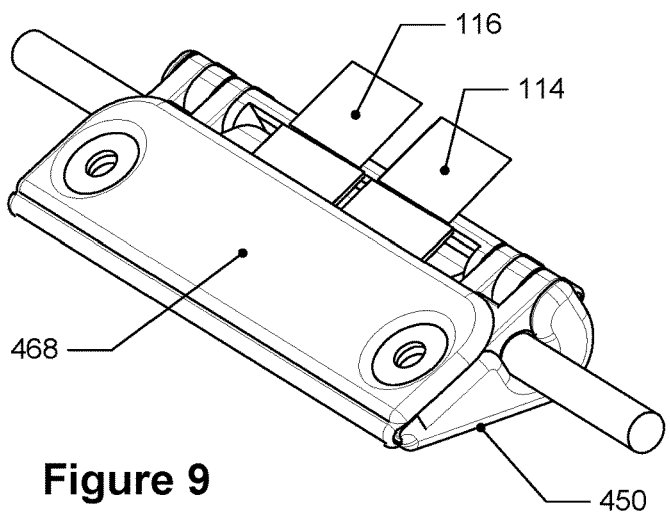
FIG. 9 depicts the insert and clamp of the module connector of FIG. 7 along with two electrical leads.

It should also be noted that the electrical leads are configured to be flexible to allow the insert to be inserted into the recess of the clamp and the movement of the clamp as described herein. For example, when the insert is placed into the recess of the clamp, the first and second electrical leads may bend or other wise move to accommodate the insert's positioning within the recess. Additionally, referring to FIG. 5, the recess 456 may be configured to receive portions of the electrical leads, which may include having a first region 457 where sections of the electrical leads may be located within the recess, as identified in the shaded portion in FIG. 5. Also, when the flap is moved, the first and second electrical leads may also move and may protrude from the clamp as depicted in FIG. 9, which depicts the insert and clamp of the module connector of FIG. 7 along with two electrical leads. Here, the first electrical lead 114 and the second electrical lead 116 protrude from the clamp in a direction different than the first direction.

To further explain the assembly and configurations of the insert, the clamp, and the module, the following example clamping sequence of the module connector of FIG. 4 is provided in FIGS. 10A-10D. FIGS. 10A-10D depict an isometric view of a portion of the module of 100 along with the insert 146 and the clamp 448. As identified in FIG. 10A, one flexible photovoltaic cell 106 is electrically connected to the second electrical lead 116 while the first electrical lead 114 is electrically connected to the bus bar 118. Additionally, the first sheet 102 of the module can be seen while the flap and the second clamping are depicted as dashed lines because they are underneath and obscured by the module 100. In this configuration and position, the second clamping surface may be considered facing the second sheet 104.

Figure 10A:
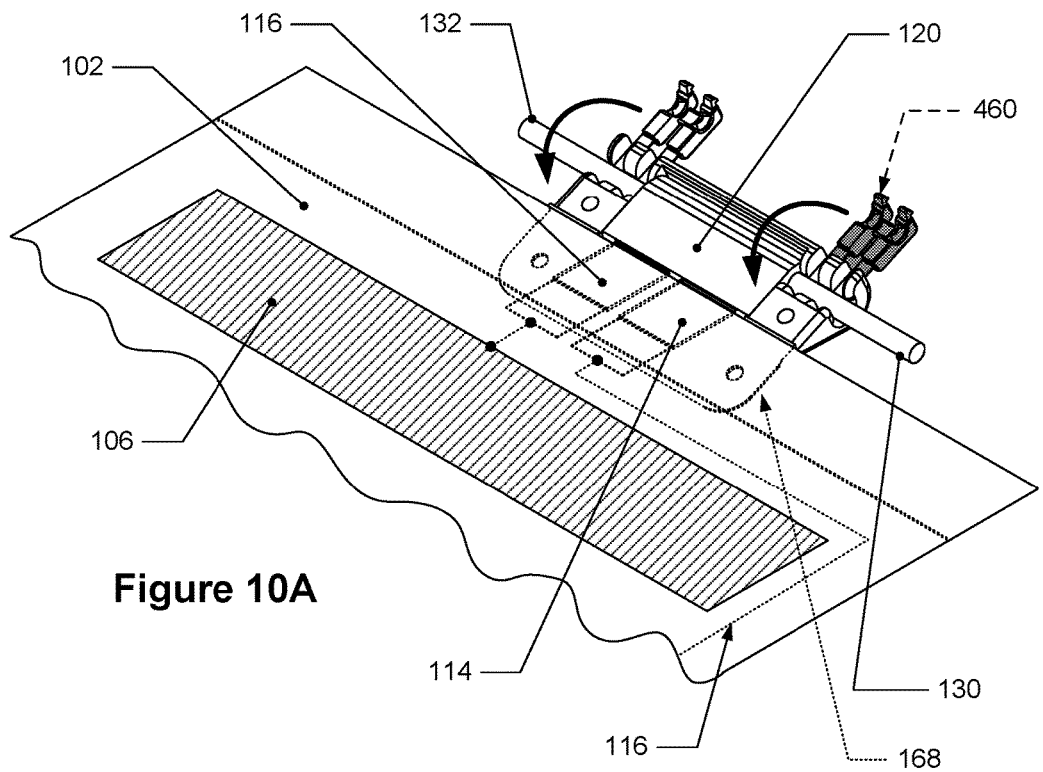
FIGS. 10A-10D depict an example clamping sequence of the module of FIG. 1 and the module connector of FIG. 4.

In FIG. 10A, like in FIG. 5, the insert body 120 (after it has already been placed and laminated into a module) is positioned within the recess 456 of the body portion 450 of the clamp 448, the first clamping portions 452A and 452B (not identified) are in an open position, the second portion of the first cable 130 and the second portion of the second cable 132 are positioned in the first clamping portions 452A and 452B, respectively, and the clamping members 460 are moveable in the direction of the arrows.

Figure 10B:
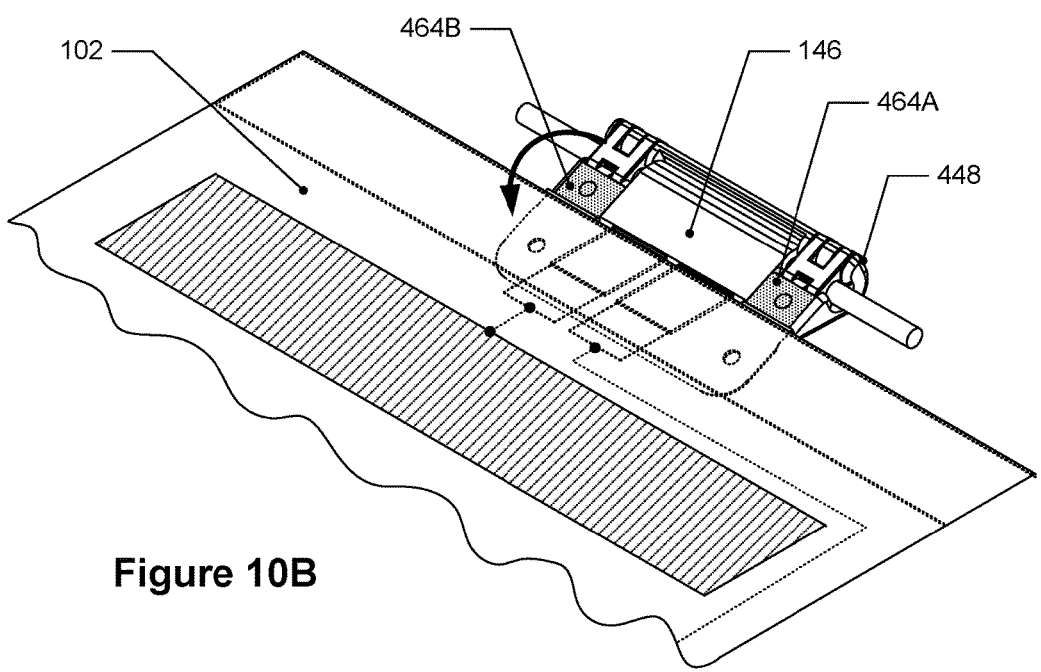

FIG. 10B depicts each first clamping portion clamping one of the cables, like described above and depicted in FIG. 6. Following this, the clamp 448 and the insert 446 may be moved such that the first clamping surface (e.g., first part 464A and second part 464B) contacts the top sheet 102, as indicated by the arrow.

Figure 10C:
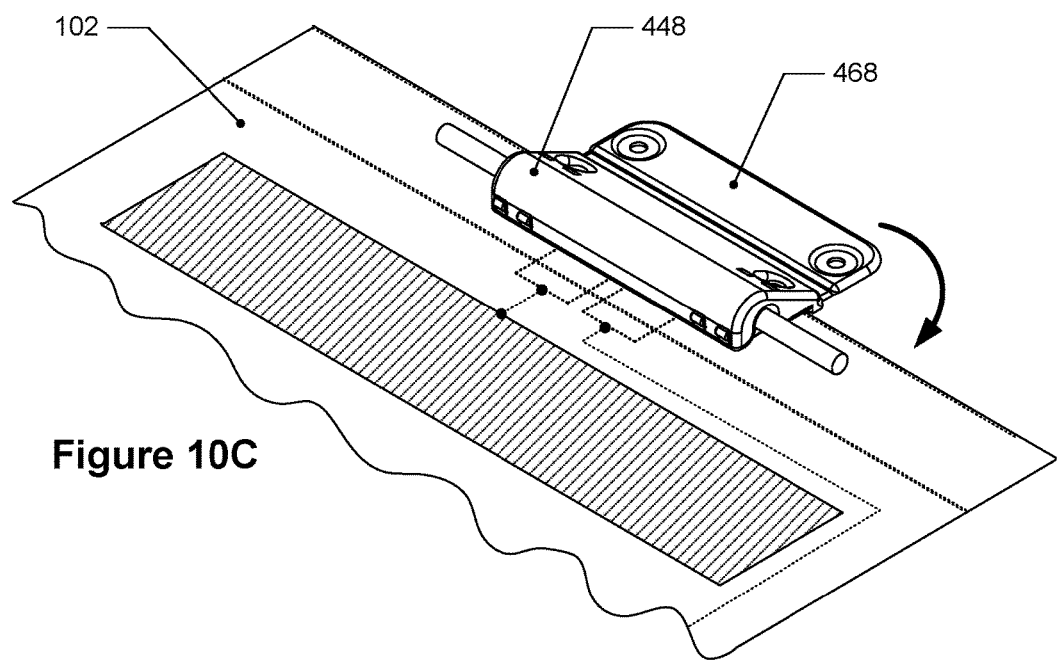
Figure 10D:
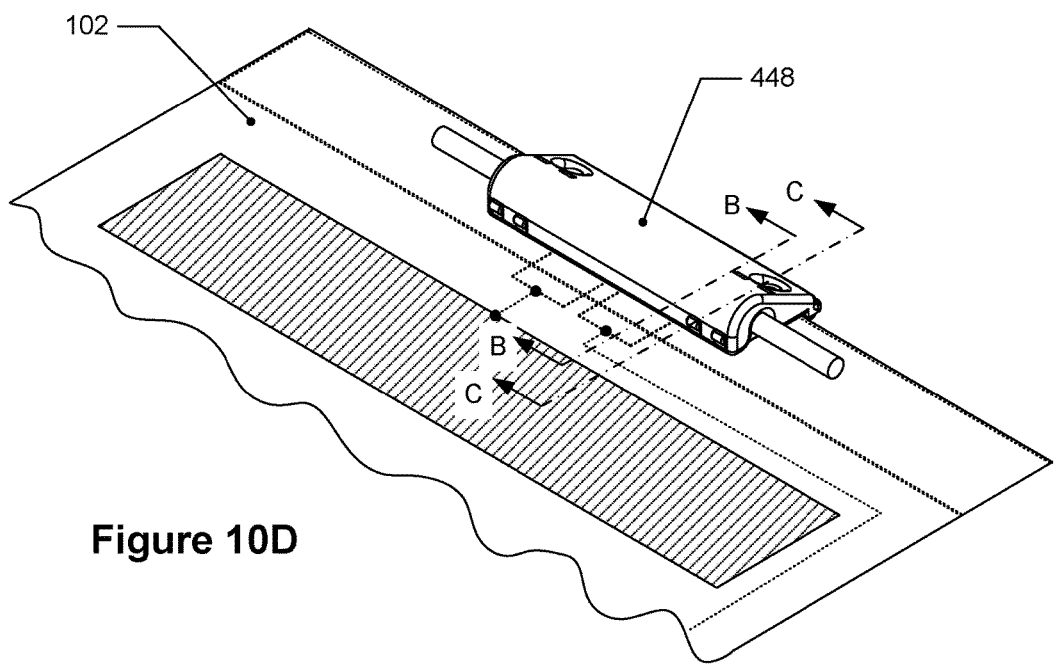

FIG. 10C depicts the first clamping surface (not seen) of the second clamping portion of the clamp 448 in contact with the first sheet 102 of the module because the clamp 448 has been partially rotated around the module. The flap 468, as stated above, may be moved such that the second clamping surface can contact the second sheet 104 (not seen in FIG. 10C). After the first and second clamping surfaces are in contact with the first and second sheets, respectively, of the module, the clamp 448 may look how it is depicted in FIG. 10D. It should be noted that FIGS. 10B and 10C may be performed in the reverse order or simultaneously with the end result being the depiction in FIG. 10D.

Figure 11:
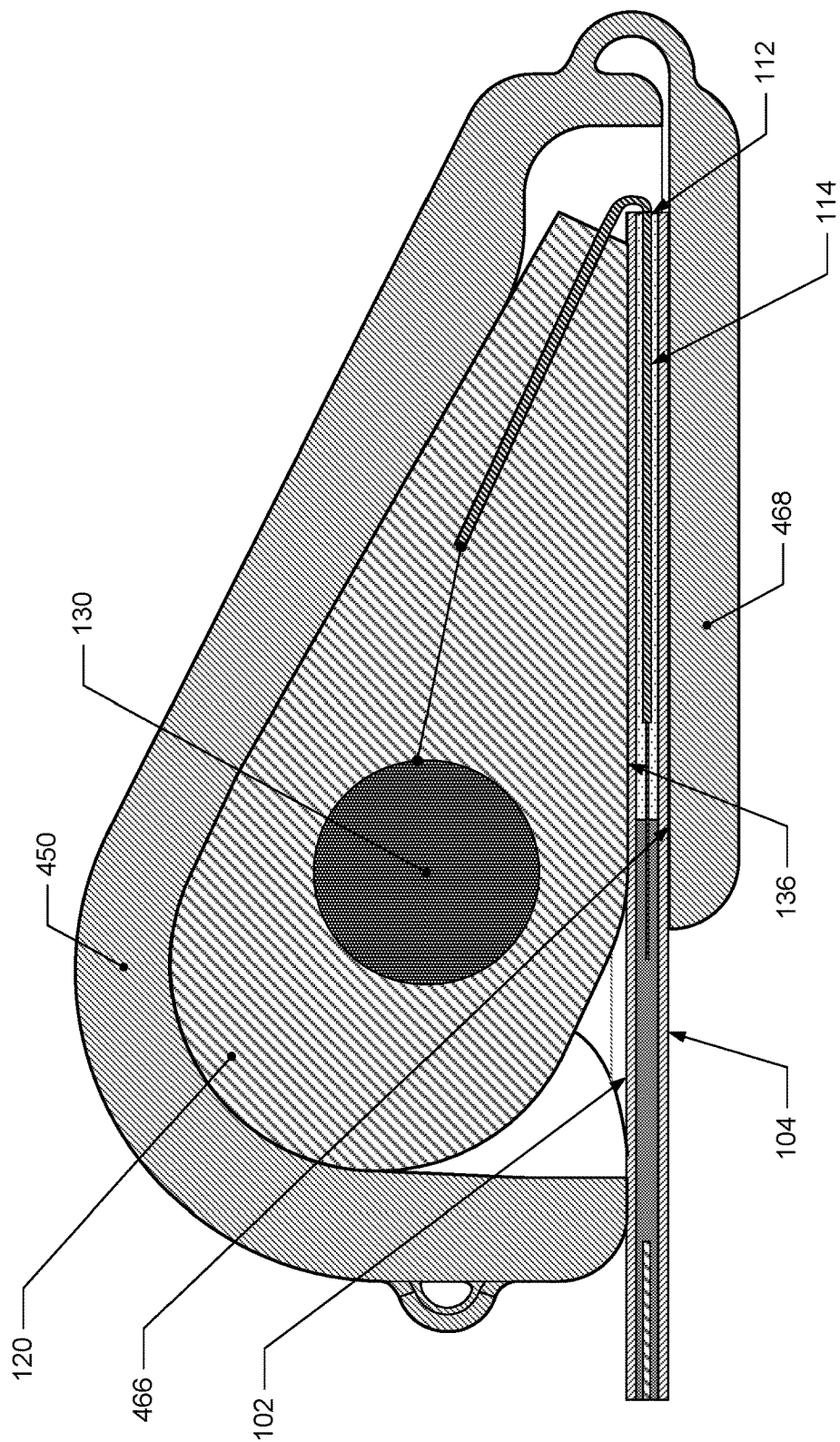
FIG. 11 depicts a partial cross-sectional detail view of the insert, the clamp, and the module along the line B-B in FIG. 10D.

FIG. 11 depicts a partial cross-sectional detail view of the insert, the clamp, and the module along the line B-B in FIG. 10D. Here in FIG. 11, the insert and clamp are positioned in an example final clamping position in which the clamp is connected to the module. Due to the location of the cross-section, the first clamping surface cannot be seen but it should still be understood that the first clamping surface is contacting the first sheet 102. As can be seen, the second clamping surface 466 is contacting the second sheet 104 and the clamp overlaps and extends around a part of the first sheet 102, a part of the exterior edge surface 112, and a part of the second sheet 104. In some embodiments, like in FIG. 11, the first surface 136 of the insert body 120 is in direct contact with the first sheet 102.

The module connector may be connected to the module using various attachment means including mechanical means, such as teeth, clamps, rivets, or bolts that extend through the clamp and penetrate partially into or fully through the module, including the seal region. In some such embodiments, the module connector is connected to the module without the use of adhesives, which may be advantageous to the manufacturing process of the module and installation because adhesive applying steps are not needed and the materials of the clamp and the module may be selected without the consideration of adhesive properties between the adhesives and the clamp and the module. This mechanical connection may also be advantageous because it may be a stronger connection than those connections made with adhesives and it may enable the footprint of the module connector to be smaller because a particular amount of surface area is not needed for adhesion to the module.

Figure 12:
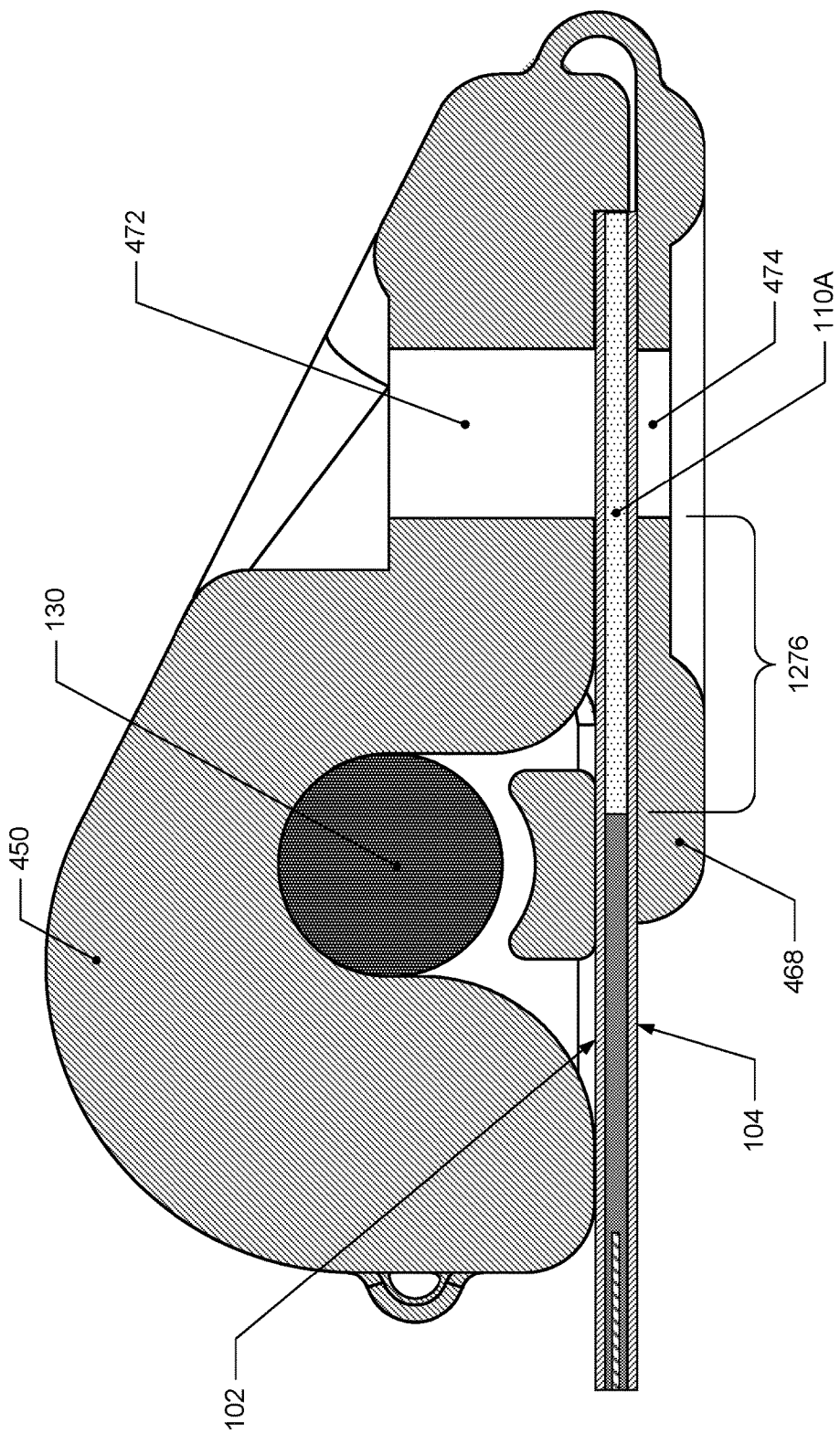
FIG. 12 depicts a partial cross-sectional detail view of the insert and the clamp along the line C-C in FIG. 10D.

In some embodiments, the attachment means attach the module connector to the module such that the module connector is in the position depicted in FIGS. 10D and 11. For example, the clamp seen in FIGS. 4-7,9, and 10A-10D includes holes that extend through the body portion of the clamp and the flap so that screws, rivets, or bolts may extend through the clamp and the module to connect the module connector to the module. A cross-sectional view of these holes is seen in FIG. 12, which depicts a partial cross-sectional detail view of the insert and the clamp along the line C-C in FIG. 10D. Here, a first hole 472 extends through the body portion 450 and a second hole 474 extends through the flap 468; these holes, in some embodiments, do not extend through the insert body 120. A third hole may also be made in the module which penetrates and extends through the first sheet 102, the seal region 110A, and the second sheet 104 so that a bolt may pass through the first hole 472, the second hole 474, and the third hole and therefore attach the module connector, including the clamp and insert, to the module.

In some embodiments, the seal region 110A and/or the first and second holes 472 and 474 of the module connector are configured such that the third hole through the module is located a first distance 1276 away from the sealed space 108 of the module, as seen in FIG. 12. This first distance 1276 may be based on a minimum seal requirement for the module that may require that the module have a non-punctured or uncompromised seal region for at least the first distance 1276, which may be about or at least about 10 millimeters; in some embodiments, the overall length of the seal region 110A may be about or at least about 20 millimeters.

It should be noted that the clamp and insert are configured such that the orientation of the clamp may be reversed relative to what is shown in the Figures; the insert body may instead contact the second sheet, which may be a bottom sheet of a module. This enables the insert body to be contacting the first sheet or the second sheet, e.g., a top sheet or a bottom sheet, of the module.

In some embodiments, the first clamping surface 464, the second clamping surface 466, or both are substantially planar surfaces (e.g., within 5% of flat). Such planarity may assist in contact with the first and second sheets of the module. Additionally, the clamp may be comprised of a polymeric material, such as a glass filled nylon, polyphenylene ether (PPE), polyphenylene oxide (PPO), and a blend of polypropylene and polyethylene-popylenediene (PP-EPDM). The clamp may have a UV resistance of about 25 years and thermal resistance of at least about 90° C.

Some of the embodiments of the module connectors disclosed herein, including the size of the clamp and its contact with the module, are configured such that they satisfy the applicable electrical and safety standards, such as safety and performance standards of the UL (Underwriters Laboratories) and the IEC (International Electrotechnical Commission). Some of these standards may require physical strength requirements as well as a minimum particular distance (e.g., at least 12.7 millimeters) from a hot electrical pathway (e.g., where the electrical leads are located within the clamp as depicted in FIG. 10D) to an interface of two different materials (e.g., where the clamp and top sheet meet). In some such embodiments, the clamp has a unitary body which may remove the existence of an interface between two portions of the clamp and therefore increase the module connector's ability to meet some such requirements.

Figure 13:
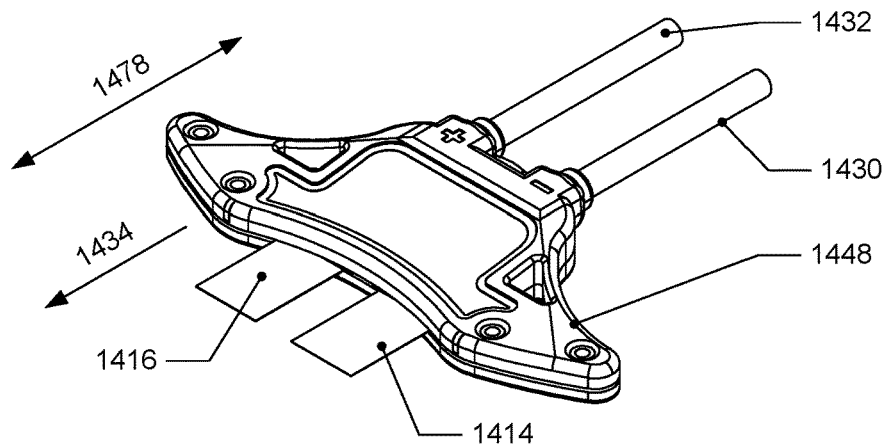
FIG. 13 depicts an isometric view of a second example module connector.
Figure 14:
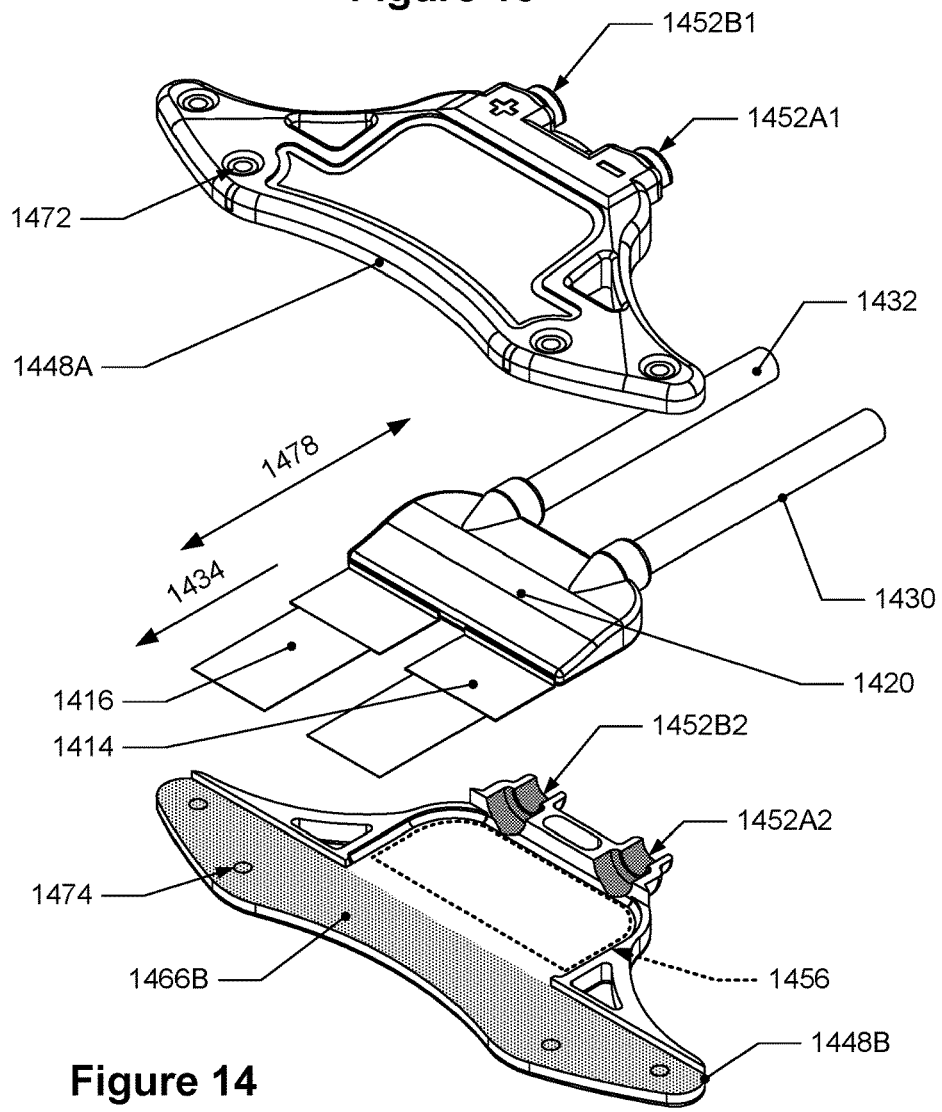
FIG. 14 depicts an exploded isometric view of the second example module connector of FIG. 13.

As noted above, in some embodiments the first and second cables may extend away from the insert body in a plane that is parallel to the first direction. FIG. 13 depicts an isometric view of a second example module connector and FIG. 14 depicts an exploded isometric view of the second example module connector of FIG. 13. Referring to FIG. 14, the insert body 1420 is seen with a first electrical lead 1414 and a second electrical lead 1416 that extend away from the insert body 1420 in the first direction 1434. Additionally, the first cable 1430 and the second cable 1432 also extend away from the insert body 1420 in a direction opposite but parallel to the first direction 1434; both directions may be considered along the first axis 1478. In some embodiments, the cable may each extend in a plane that is parallel to the first axis 178. The first electrical lead 1414, the second electrical lead 1416, the first cable 1430 and the second cable 1432 each have the first and second portions discussed above with respect to at least FIGS. 1, 2, and 4. For instance, the first cable 1430 is electrically connected to the first electrical lead 1414 in the insert body 1420 and sealed within the insert body 1420. In some embodiments, the directions of the electrical directions are not limited to parallel or perpendicular directions, but may extend at any angle or angles.

The second example module connector of FIGS. 13 and 14 also includes a clamp 1448 but here, the clamp 1448 includes a top part 1448A and a bottom part 1448B. In some embodiments, like in FIGS. 14 and 13, these two parts of the clamp may not be a unitary body or may not be connected to each other before being connected to a module; in other embodiments, these two parts may be a unitary body or flexibly connected such that they are moveable with respect to each other, similar to the body portion and flap described above. The clamp 1448 includes a recess 1456 (identified with a dotted line) in FIG. 14 and each part of the clamp may include a portion of the recess 1456 such that the insert body 1420 is insertable into both the top part 1448A and the bottom part 1448B of the clamp.

First clamping portions and a second clamping portion are also included on the clamp 1448. Like above, the clamp 1448 may have two first clamping portions that are each configured to clamp a cable and connect that cable to the body portion of the clamp. Here in FIG. 14, each first clamping portion may have a first section, 1452A1 and 1452B1, located on the top part 1448A and a second section 1452A2 and 1452B2 located on the bottom part 1448B. These two sections of each first clamping portion may be configured to receive a cable (e.g., first cable 1430), clamp the cable so that the cable is connected to the clamp 1448, and crimp the cable.

Also like above, the second clamping portion of the second example module connector of FIGS. 13 and 14, may have a first clamping surface that is located on the top part 1448A (not visible in FIGS. 13 and 14) and a second clamping surface 1466B that is located on the bottom part 1448B. The second clamping portion here is also configured like the second clamping portion discussed above, including configured to connect the clamp to the module such that the clamp overlaps and extends around a part of first sheet, a part of the exterior edge surface, and a part of the second sheet.

The clamp 1448 includes holes that are configured to enable attachment means to connect the clamp to the module. This includes a first hole 1472 in the top part 1468A and a second hole 1474 in the bottom part 1468B.

Figure 15:
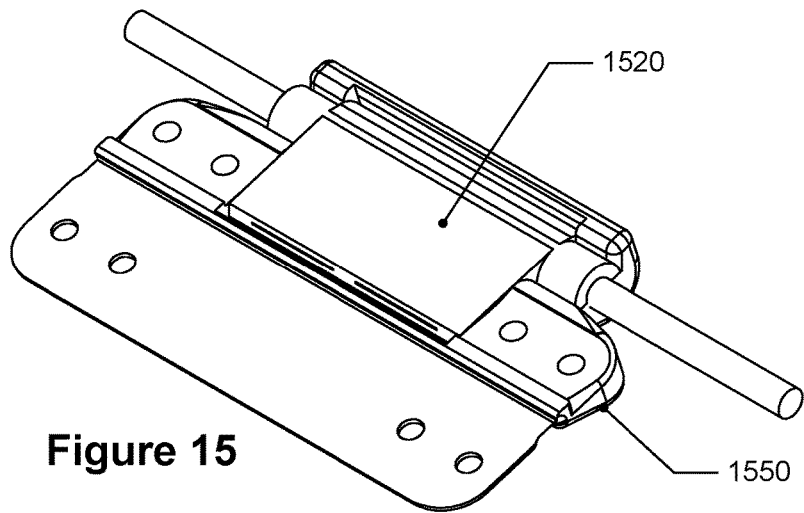
FIG. 15 depicts an isometric view of a third example module connector.
Figure 16:
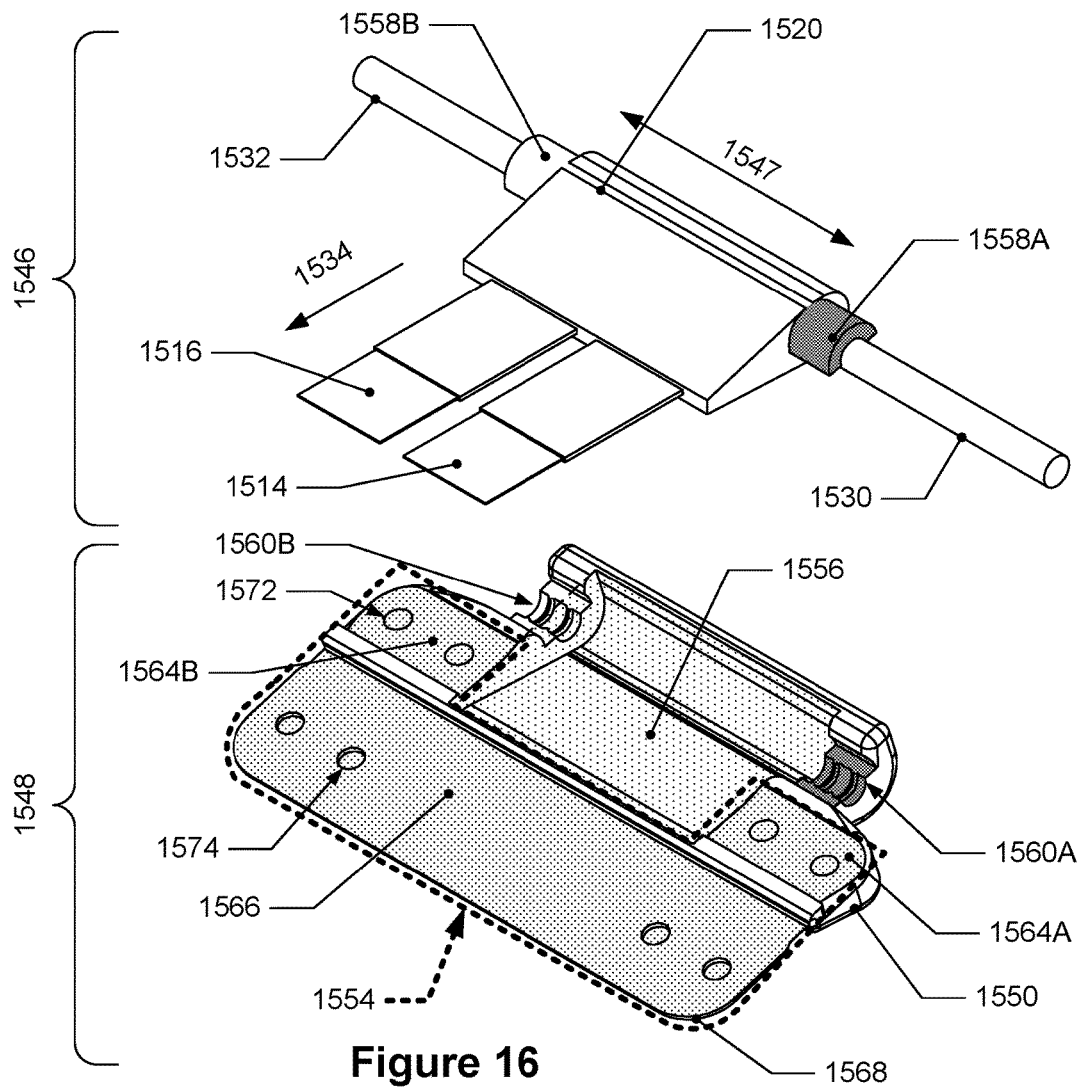
FIG. 16 depicts an exploded isometric view of the third example module connector of FIG. 15.

In some embodiments, the insert body may be configured to, at least in part, clamp the cable to the body portion of the clamp. In such embodiments, the module connector of FIGS. 15 and 16 has a first clamping portion separated into two sections, with one section on the insert body and the other section on the body portion of the clamp. FIG. 15 depicts an isometric view of a third example module connector while FIG. 16 depicts an exploded isometric view of the third example module connector of FIG. 15. In FIG. 16, the insert body 1620 is inserted into a recess of the body portion 1650 of the clamp, similar to described above. The module connector of FIG. 15 is similar to that described above with respect to FIGS. 4-9. In FIG. 15, the insert 1646 includes the insert body 1520, the first electrical lead 1514, the first cable 1530, the second electrical lead 1516, and the second cable 1532, which may be configured and arranged like described above. The first electrical lead 1514 extends away from the insert body 1520 in the first direction 1534 and the first cable 1530 extends away from the insert body 1520 along the second axis 1547.

In FIG. 16, the insert body 1520 includes a first section 1558A (shown with dark shading) of a first clamping portion that is depicted as a first wing that extends away from the insert body in a direction along the second axis 1547. The body portion 1550 of the clamp 1548 includes a second section 1560A (shown with dark shading) of the first clamping portion and together the first section 1558A and the second section 1560A are configured to clamp the first cable 1530 to the body portion 1550 of the clamp 1548, like can be seen in FIG. 15. Here, the second section 1560A of the first clamping portion may be configured like above, such as configured to receive the first cable 1530. The first clamping portion may also be configured to crimp the cable. The module connector of FIGS. 15 and 16 also has another first clamping portion that has another first section 1558B and another second section 1560B configured to clamp the second cable 1532 to the body portion 1550.

The clamp 1548 of FIGS. 15 and 16 is configured similar to the clamp 448 described above, including the body portion 1550, the recess 1556, the flap 1568, the second clamping portion 1554, the first clamping surface 1564A and 1564B, and the second clamping surface 1566. Also like above, the module connector of FIGS. 15 and 16 is configured to be connected to the module with mechanical means, e.g., without any adhesives, which includes having first and second holes, 1572 and 1574, as well as connected to the module like described in FIGS. 10B-10D, 11, and 12.

In some embodiments, the insert disclosed herein may be configured such that the electrical connections between the electrical leads and the cables are made and sealed inside the insert body, e.g., via overmolding, before or during the module manufacturing. This reduces the manufacturing and/or installation steps, as well as reduces the potential for disconnections, loose connections, or other adverse effects on these electrical connections, and thus increases reliability and safety of the module. As also noted above, the connection of the cable to the body portion of the clamp and the corresponding connection of the clamp to the module also increases the structural stability and safety of the electrical leads and electrical connectors of the module. Because of the electrical configuration of the insert disclosed herein, in some embodiments the module connector of the present disclosure may not be considered to be or to have a junction box as commonly understood in the art. With such junction boxes, electrical junctions are made within the junction boxes by a user after the module has been fabricated, e.g., by welding or soldering the electrical junction between to electrical components during installation, and the junction boxes typically involve sealing procedures, such as the use of an O-ring or potting.

It should also be noted that some embodiments of the module connector disclosed herein reduce the surface area that the module takes up after installation. For example, less surface area may be required for a module because the majority of the module connector is located on or within the surface area of the module; the module connector may add a small amount of area to the effective surface area of the module. Additionally, the area of the module that may be used for mounting the module connector may be reduced as compared to the area used in traditional modules, thereby increasing the available surface area for photovoltaic cells within the module of the present disclosure, i.e., increasing the total module area efficiency.

What is claimed is:

1. An apparatus comprising:
   a module connector for a flexible photovoltaic module, the flexible photovoltaic module having a first sheet, a second sheet, one or more flexible photovoltaic cells positioned in a sealed space between the first sheet and the second sheet, and a seal region that spans between a first section of the first sheet and a second section of the second sheet and that forms a part of an exterior edge surface of the flexible photovoltaic module and, wherein the module connector includes:
   an insert that is configured to be inserted into a clamp and that includes:
     an insert body,
     an electrical lead with a first portion that extends into and is sealed inside the insert body, and a second portion outside the insert body that extends away from the insert body in a first direction, and
     a cable with a first portion that extends into and is sealed inside the insert body, and a second portion outside the insert body that extends away from the insert body in a second direction, wherein the electrical lead and the cable are electrically coupled to each other inside the insert body; and
   the clamp that includes:
     a body portion that has a recess configured to receive the insert body,
     a first clamping portion that is configured to clamp the second portion of the cable to connect the cable to the body portion, and
     a second clamping portion that has a first clamping surface configured to contact the first sheet and a second clamping surface configured to contact the second sheet, and that is configured to connect the clamp to the flexible photovoltaic module such that the clamp overlaps and extends around a part of the first sheet, a part of the exterior edge surface, and a part of the second sheet.

2. The apparatus of claim 1, wherein:
   the insert further includes:
     a second electrical lead with a first portion that extends into and is sealed inside the insert body, and a second portion outside the insert body that extends away from the insert body in the first direction, and a second cable with a first portion that extends into and is sealed inside the insert body, and a second portion outside the insert body that extends away from the insert body in the second direction, wherein the second electrical lead and the second cable are electrically coupled to each other inside the insert body; and the clamp further includes a third clamping portion that is configured to clamp the second portion of the second cable to connect the second cable to the body portion.

3. The apparatus of claim 1, further comprising the flexible photovoltaic module, wherein:
the second portion of the electrical lead extends through the seal region and into the sealed space, and
the electrical lead is electrically connected to at least one of the flexible photovoltaic cells.

4. The apparatus of claim 3, wherein:
the insert is positioned within the recess of the body portion of the clamp,
the first clamping portion is clamping the second portion of the cable such that the cable is connected to the body portion,
the first surface is contacting the first sheet,
the second surface is contacting the second sheet,
the clamp overlaps and extends around the part of the first sheet, the part of the exterior edge surface, and the part of the second sheet, and
the clamp is connected to the flexible photovoltaic module.

5. The apparatus of claim 4, wherein the clamp is connected to the flexible photovoltaic module by an attachment means that extends through at least the body portion, the first sheet, the seal region, and the second clamping portion.

6. The apparatus of claim 1, wherein the second clamping portion of the clamp is configured to be moveable such that the first surface and the second surface face each other and are offset from each other.

7. The apparatus of claim 1, wherein:
the first surface is located on the body portion,
the clamp further comprises a flap that is connected to the body portion and that is configured to be moveable with respect to the body portion, and
the second surface is located on the flap.

8. The apparatus of claim 7, wherein the clamp further comprises a flexible connector that flexibly connects the flap to the body portion.

9. The apparatus of claim 8, wherein the body portion, the flap, and the flexible connector are a unitary body.

10. The apparatus of claim 1, wherein the first clamping surface and the second clamping surface are planar surfaces.

11. The apparatus of claim 1, wherein the first direction is orthogonal to the second direction.

12. The apparatus of claim 1, wherein the first direction is parallel to the second direction.

13. The apparatus of claim 1, wherein:
the insert body includes a first planar exterior surface and a second planar exterior surface,
the first planar exterior surface is at an angle of between about 140 to about 180 degrees from the first direction, and
the second planar exterior surface is at an angle of between about 140 to about 180 degrees from the first direction.

14. A flexible photovoltaic module comprising:
a first sheet,
a second sheet,
one or more flexible photovoltaic cells positioned in a sealed space between the first sheet and the second sheet,
a seal region that spans between a first section of the first sheet and a second section of the second sheet and that forms a part of an exterior edge surface of the flexible photovoltaic module,
a module connector having an insert body,
a first electrical lead having a first portion and a second portion,
a first cable having a first portion and a second portion, and
a clamp having a body portion with a recess configured to receive the insert body, a first clamping portion, and a second clamping portion, wherein:
the insert body is configured to be inserted into the clamp,
the first portion of the first electrical lead extends into and is sealed inside the insert body,
the second portion of the first electrical lead is outside the insert body, extends away from the insert body in a first direction, extends through the seal region and into the sealed space, and is electrically connected to at least one of the flexible photovoltaic cells,
the first portion of the first cable extends into and is sealed inside the insert body, is outside the insert body, extends away from the insert body in a second direction, and is electrically coupled to the electrical lead inside the insert body,
the first clamping portion is configured to clamp the second portion of the first cable to connect the first cable to the body portion, and
the second clamping portion has a first surface configured to contact the first sheet, a second surface configured to contact the second sheet, and is configured to connect the clamp to the flexible photovoltaic module such that the clamp overlaps and extends around a part of first sheet, a part of the exterior edge surface, and a part of the second sheet.

15. The flexible photovoltaic module of claim 14, wherein:
the insert is positioned within the recess of the body portion of the clamp,
the first clamping portion is clamping the second portion of the first cable such that the first cable is connected to the body portion,
the first surface is contacting the first sheet,
the second surface is contacting the second sheet,
the clamp overlaps and extends around the part of first sheet, the part of the exterior edge surface, and the part of the second sheet, and
the clamp is connected to the flexible photovoltaic module.

16. The flexible photovoltaic module of claim 15, wherein the clamp is connected to the flexible photovoltaic module by an attachment means that extends through the body portion, the first sheet, the seal region, and the second clamping portion.

17. The flexible photovoltaic module of claim 14, further comprising:
a second electrical lead with a first portion that extends into and is sealed inside the insert body, and a second portion outside the insert body that extends away from the insert body in the first direction;
a second cable with a first portion that extends into and is sealed inside the insert body, and a second portion outside the insert body that extends away from the insert body in the second direction, wherein:
- the second electrical lead and the second cable are electrically coupled to each other inside the insert body, and
- the clamp further includes a third clamping portion that is configured to clamp the second portion of the second cable to connect the second cable to the body portion.

18. The flexible photovoltaic module of claim 17, wherein:
- the insert is positioned within the recess of the body portion of the clamp,
- the first clamping portion is clamping the second portion of the first cable such that the first cable is connected to the body portion,
- the third clamping portion is clamping the second portion of the second cable such that the second cable is connected to the body portion,
- the first surface is contacting the first sheet,
- the second surface is contacting the second sheet,
- the clamp overlaps and extends around the part of first sheet, the part of the exterior edge surface, and the part of the second sheet, and
- the clamp is connected to the flexible photovoltaic module.

19. The flexible photovoltaic module of claim 18, wherein the first direction is orthogonal to the second direction.

20. The flexible photovoltaic module of claim 18, wherein the first direction is parallel to the second direction.

\* \* \* \* \*